(12) United States Patent
Park et al.

(10) Patent No.: US 12,507,397 B2
(45) Date of Patent: Dec. 23, 2025

(54) SEMICONDUCTOR DEVICE

(71) Applicant: Samsung Electronics Co., Ltd., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 482 days.

(21) Appl. No.: 18/116,071

(22) Filed: Mar. 1, 2023

(65) Prior Publication Data

US 2024/0008254 A1 Jan. 4, 2024

(30) Foreign Application Priority Data

Jun. 29, 2022 (KR) .................. 10-2022-0079999

(51) Int. Cl.
*H10B 12/00* (2023.01)
(52) U.S. Cl.
CPC .......... *H10B 12/315* (2023.02); *H10B 12/033* (2023.02)
(58) Field of Classification Search
CPC .................... H10B 12/033; H10B 12/315
See application file for complete search history.

(56) References Cited

U.S. PATENT DOCUMENTS

| | | | |
|---|---|---|---|
| 6,238,964 B1 | 5/2001 | Cho | |
| 7,148,118 B2 | 12/2006 | Zheng et al. | |
| 8,623,738 B2 | 1/2014 | Shih et al. | |
| 9,728,409 B2 | 8/2017 | Harada et al. | |
| 9,799,658 B2 * | 10/2017 | Lugani | H10B 12/033 |
| 11,244,946 B2 | 2/2022 | An et al. | |
| 11,289,487 B2 | 3/2022 | Rocklein et al. | |
| 11,488,958 B2 * | 11/2022 | An | H10B 12/315 |
| 11,812,601 B2 | 11/2023 | Kang et al. | |
| 2006/0068104 A1 | 3/2006 | Ishizaka et al. | |
| 2013/0168812 A1 | 7/2013 | Lee et al. | |
| 2013/0214382 A1 | 8/2013 | Wang et al. | |

(Continued)

FOREIGN PATENT DOCUMENTS

| | | |
|---|---|---|
| CN | 112750950 A | 5/2021 |
| JP | 2014-086585 A | 5/2014 |

(Continued)

OTHER PUBLICATIONS

Notice of Allowance dated Mar. 5, 2024 for corresponding TW Patent Application No. 112118005.

*Primary Examiner* — Steven M Page
(74) *Attorney, Agent, or Firm* — Muir Patent Law, PLLC

(57) ABSTRACT

A semiconductor device includes a substrate, a lower electrode above the substrate, the lower electrode extending in a vertical direction, a support surrounding a side wall of the lower electrode and supporting the lower electrode, a dielectric layer on the lower electrode and the support, and an upper electrode on the dielectric layer, wherein the lower electrode includes a base electrode layer and an insertion layer, the base electrode layer containing a halogen element, and the insertion layer containing carbon, and the insertion layer is inserted in a portion of the lower electrode, the portion of the lower electrode being adjacent to the support and the dielectric layer.

20 Claims, 22 Drawing Sheets

(56) References Cited

U.S. PATENT DOCUMENTS

| | | | |
|---|---|---|---|
| 2016/0141290 A1 | 5/2016 | Kang | |
| 2016/0293421 A1 | 10/2016 | Harada et al. | |
| 2019/0067453 A1 | 2/2019 | Torek | |
| 2022/0328303 A1* | 10/2022 | Lee | H10D 48/047 |
| 2024/0008254 A1* | 1/2024 | Park | H10D 1/716 |

FOREIGN PATENT DOCUMENTS

| | | |
|---|---|---|
| KR | 10-0214278 B1 | 8/1999 |
| KR | 10-0310825 B1 | 10/2001 |
| KR | 10-2009-0076354 A | 7/2009 |
| KR | 10-2013-0017865 A | 2/2013 |
| TW | 201120999 A | 6/2011 |
| TW | 201232712 A | 8/2012 |
| TW | 201330285 A | 7/2013 |
| TW | 202205629 A | 2/2022 |

\* cited by examiner

SEMICONDUCTOR DEVICE

CROSS-REFERENCE TO RELATED APPLICATION

This application is based on and claims priority under 35 U.S.C. § 119 to Korean Patent Application No. 10-2022-0079999, filed on Jun. 29, 2022, in the Korean Intellectual Property Office, the disclosure of which is incorporated by reference herein in its entirety.

BACKGROUND

The present disclosure relates to a semiconductor device, and more particularly, to a semiconductor device including a capacitor.

With the high integration density of semiconductor memory devices, circuit patterns are increasingly miniaturized to form more semiconductor memory devices in the same area. With the increase in integration density of semiconductor memory devices, the design rules for the components of semiconductor memory devices have been decreased.

A process of forming a capacitor in highly scaled semiconductor memory devices is becoming complex and difficult. There is a limit to securing desired capacitance with a capacitor having a known structure in a miniaturized semiconductor device.

SUMMARY

Aspects of the inventive concept provide a semiconductor device including a capacitor having increased performance and reliability.

The inventive concept is not limited to what is mentioned above and will be clearly understood by one of ordinary skill in the art from the descriptions below.

According to an aspect of the inventive concept, a semiconductor device includes a substrate, a lower electrode above the substrate, the lower electrode extending in a vertical direction, a support surrounding a side wall of the lower electrode and supporting the lower electrode, a dielectric layer on the lower electrode and the support, and an upper electrode on the dielectric layer. The lower electrode includes a base electrode layer and an insertion layer outside of the base electrode layer, the base electrode layer containing a halogen element, and the insertion layer containing carbon. The insertion layer is inserted in a portion of the lower electrode, the portion of the lower electrode being adjacent to the support and the dielectric layer.

According to another aspect of the inventive concept, a semiconductor device includes a substrate, a lower electrode above the substrate, the lower electrode extending in a vertical direction, a support contacting a side wall of the lower electrode and supporting the lower electrode, a dielectric layer on the lower electrode and the support, and an upper electrode on the dielectric layer. The lower electrode includes a base electrode layer and carbon, the base electrode layer containing a halogen element, and the carbon being distributed in the base electrode layer, the base electrode layer includes a periphery and a core, the periphery extending in the vertical direction and including a portion adjacent to the support and the dielectric layer, and the core extending in the vertical direction and including a portion not adjacent to the support or the dielectric layer, and a concentration of the carbon in the lower electrode is higher in the periphery than in the core.

According to a further aspect of the inventive concept, a semiconductor device includes a substrate, an active region defined by an isolation film in the substrate, a word line extending in the substrate in a first horizontal direction across the active region, a bit line above the word line, the bit line extending in a second horizontal direction that is perpendicular to the first horizontal direction, and a capacitor in an upper level above the bit line. The capacitor includes a lower electrode above the substrate, the lower electrode extending in a direction that is perpendicular to a top surface of the substrate, a support surrounding a side wall of the lower electrode and supporting the lower electrode, a dielectric layer on the lower electrode and the support, and an upper electrode on the dielectric layer. The lower electrode includes a base electrode layer and an insertion layer, the base electrode layer containing a halogen element, and the insertion layer containing carbon, and the insertion layer is inserted in a portion of the lower electrode, the portion of the lower electrode being adjacent to the support and the dielectric layer.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments are described in detail with reference to the accompanying drawings.

Figure 1:
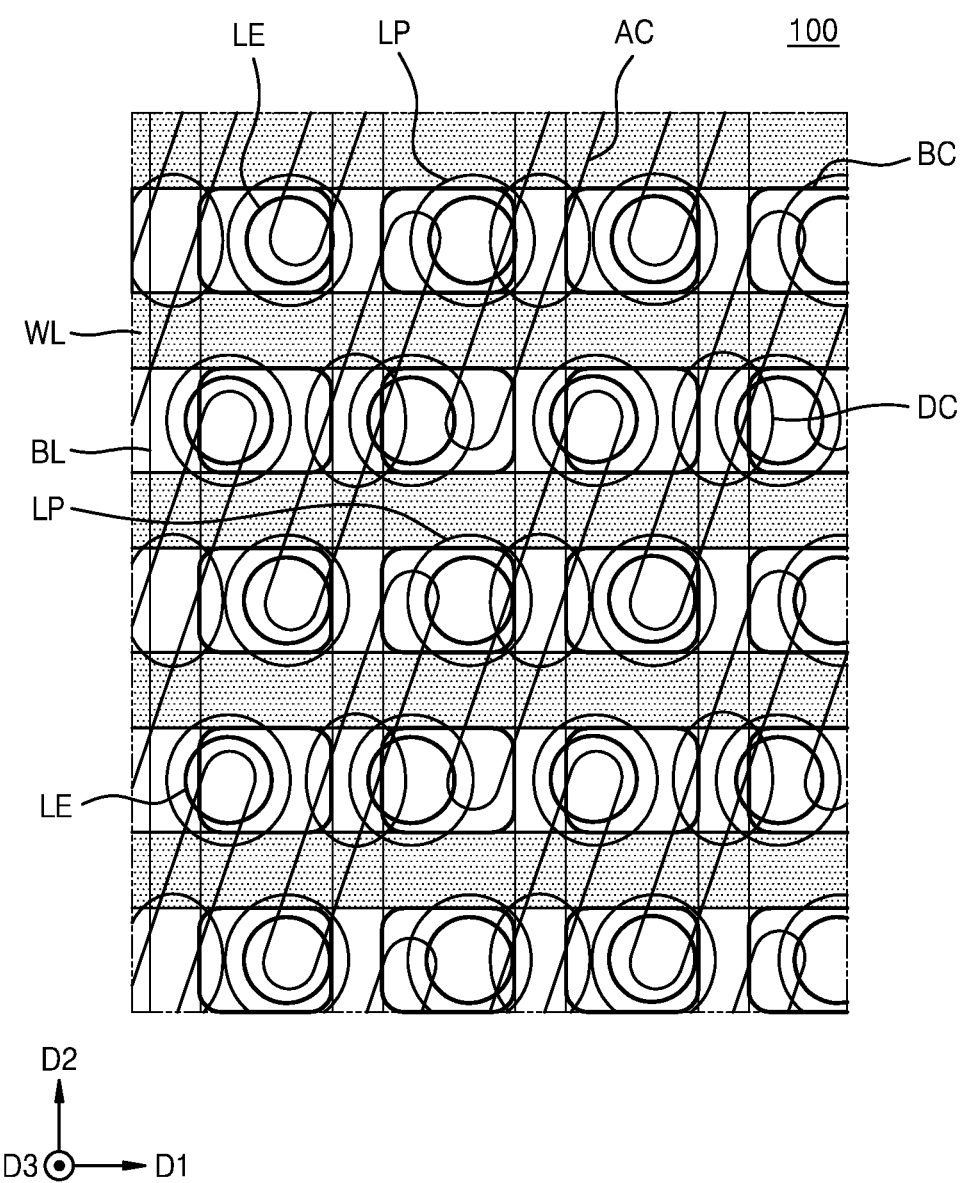
FIG. 1 is a schematic plane layout diagram of partial configurations of a memory cell array region of a semiconductor device, according to embodiments.

FIG. 1 is a schematic plane layout diagram of partial configurations of a memory cell array region of a semiconductor device, according to embodiments. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages.

Referring to FIG. 1, a semiconductor device 100 may include a plurality of active regions AC, which horizontally extend in a direction diagonal to a first direction D1 and a second direction D2 on a plane. A plurality of word lines WL may extend across the active regions AC to be parallel with each other in the first direction D1. A plurality of bit lines BL may extend over the word lines WL to be parallel with each other in the second direction D2 that crosses the first direction D1. Each of the bit lines BL may be connected to an active region AC through a direct contact DC.

A plurality of buried contacts BC may be between two adjacent bit lines BL among the bit lines BL. A plurality of conductive landing pads LP may be respectively above the buried contacts BC. Each of the conductive landing pads LP may overlap with at least a portion of a buried contact BC. A plurality of lower electrodes LE may be respectively above the conductive landing pads LP to be separated from each other. A plurality of lower electrodes LE may be connected to a plurality of active regions AC through a plurality of buried contacts BC and a plurality of conductive landing pads LP. Each electrode of the plurality of lower electrodes LE may be a lower electrode of a capacitor, which may be, for example, a memory cell of a DRAM chip that forms a semiconductor device.

Figure 2:
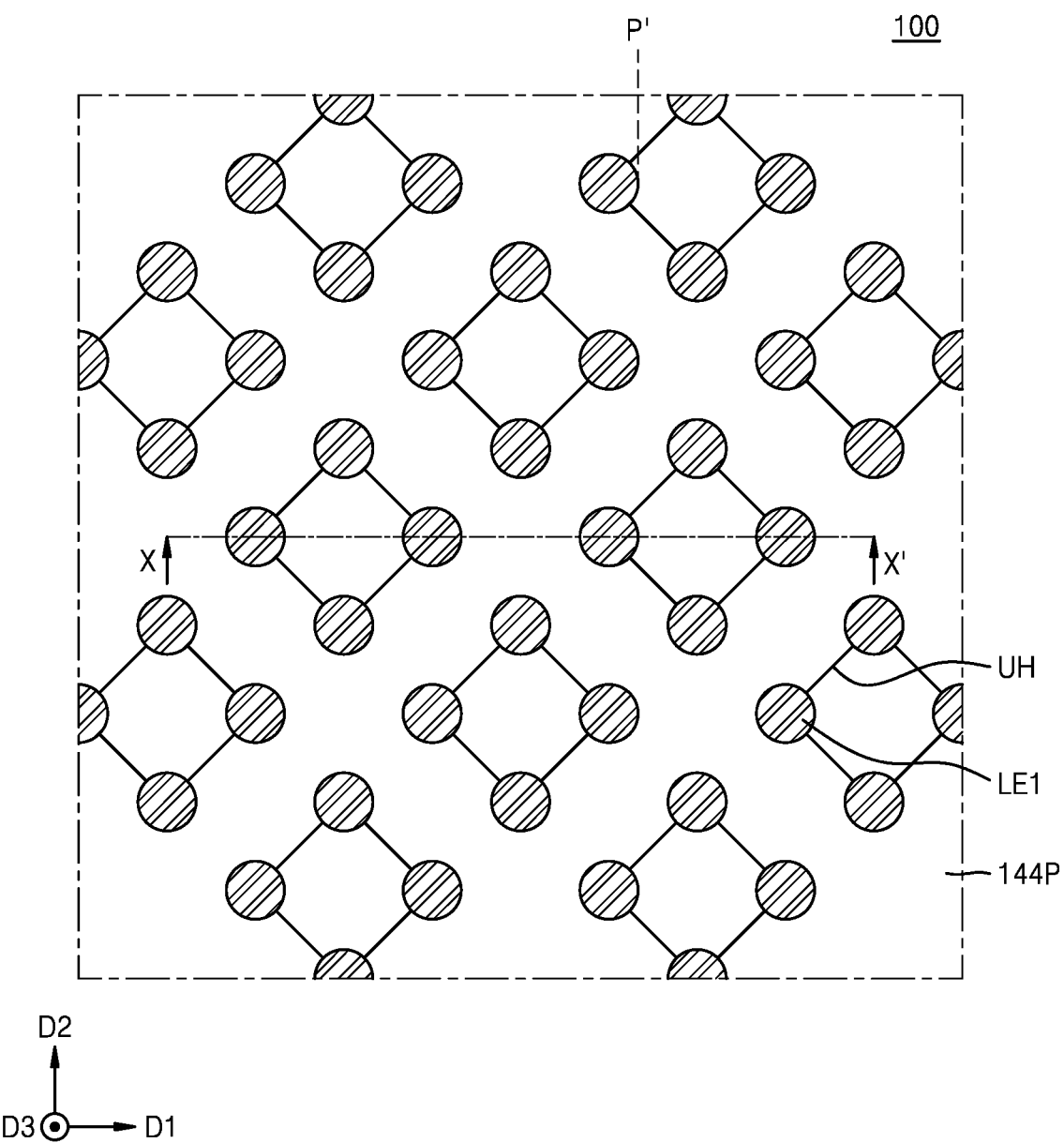
FIG. 2 is a plan view showing a partial configuration of the semiconductor device of FIG. 1.
Figure 3A:
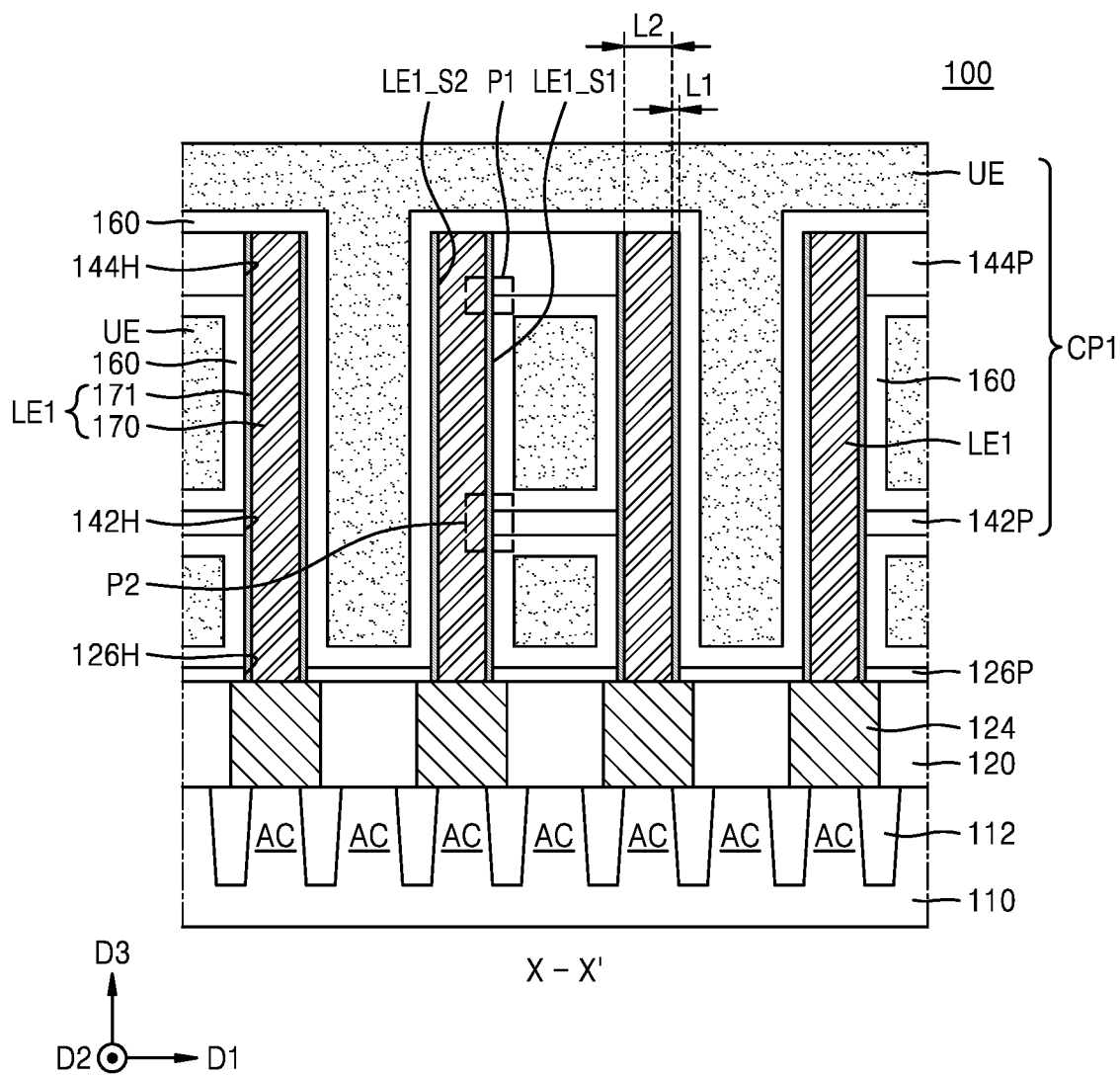
FIG. 3A is a schematic cross-sectional view showing a partial configuration of a cross-section taken along line X-X' in FIG. 2.
Figure 3B:
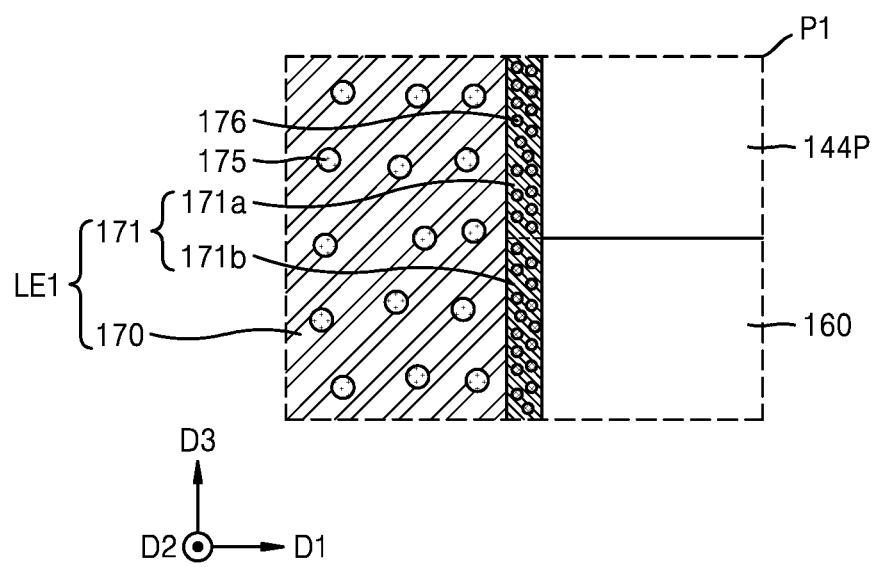
FIGS. 3B and 3C are enlarged cross-sectional views of regions P1 and P2, respectively, in FIG. 3A.
Figure 3C:
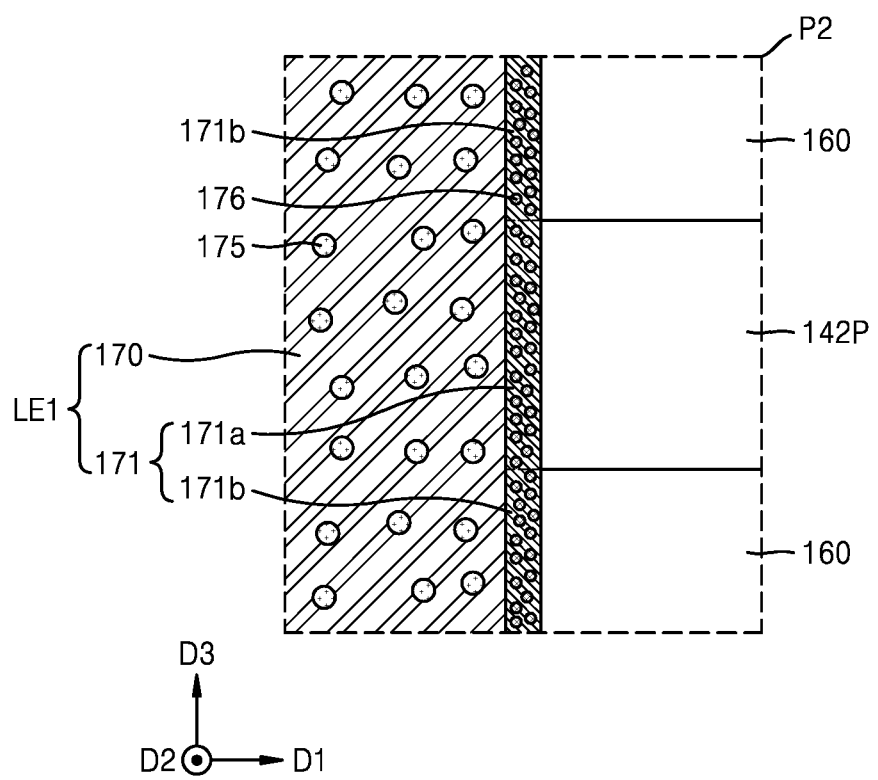

FIG. 2 is a plan view showing a partial configuration of the semiconductor device 100 of FIG. 1. FIG. 3A is a schematic cross-sectional view showing a partial configuration of a cross-section taken along line X-X' in FIG. 2. FIGS. 3B and 3C are enlarged cross-sectional views of regions P1 and P2, respectively, in FIG. 3A.

Referring to FIGS. 2 and 3A to 3C, the semiconductor device 100 may include a substrate 110 including a plurality of active regions AC, and a lower structure 120 on the substrate 110. A plurality of conductive regions 124 may pass through the lower structure 120 to be respectively connected to a plurality of active regions AC.

The substrate 110 may include a semiconductor element, such as Si or Ge, or a compound semiconductor, such as SiC, GaAs, InAs, or InP. For example, the substrate 110 may be a Si substrate, a Ge substrate, or a substrate made of a compound semiconductor. The substrate 110 may include a semiconductor substrate and structures, which include at least one insulating film or at least one conductive region on the semiconductor substrate. For example, the conductive region may include an impurity-doped well or an impurity-doped structure. An isolation film 112 defining the active regions AC may be formed in the substrate 110. The isolation film 112 may include or be an oxide film, a nitride film, or a combination thereof. In some embodiments, the isolation film 112 may have one of various structures including a shallow trench isolation (STI) structure.

In some embodiments, the lower structure 120 may include or be formed of a silicon oxide film, a silicon nitride film, or an insulating film constituted of a combination thereof. In some embodiments, the lower structure 120 may include various conductive regions, such as a wiring layer, a contact plug, and a transistor, and an insulating film, which insulates the conductive regions from each other. The conductive regions 124 may include or be formed of polysilicon, metal, conductive metal nitride, metal silicide, or a combination thereof. The lower structure 120 may include the bit lines BL described above with reference to FIG. 1. Each of the conductive regions 124 may include a buried contact BC and a conductive landing pad LP, which are described above with reference to FIG. 1. The conductive regions 124 in FIG. 3A are drawn to show a general connection, but do not include the details of the various components that may connect between the substrate 110 and the structure formed above the lower structure 120.

An insulating pattern 126P may be on the lower structure 120 and the conductive regions 124 and may have a plurality of openings 126H, which respectively overlap with the conductive regions 124 (e.g., with top surfaces of components of the conductive regions) in a third direction D3, which may be referred to as a vertical direction D3. The insulating pattern 126P may include or be formed of a silicon nitride (SiN) film, a silicon carbonitride (SiCN) film, a silicon boron nitride (SiBN) film, or a combination thereof. Each of the terms "SiN", "SiCN", and "SiBN" used herein indicates a material composed of elements included in each term and is not a chemical equation representing stoichiometric relationships.

A plurality of capacitors CP1 may be on the conductive regions 124. Each of the capacitors CP1 may include a lower electrode LE1 extending in a direction (i.e., the vertical direction D3) perpendicular to the top surface of the substrate 110, lower and upper supports 142P and 144P surrounding the side wall of the lower electrode LE1, contacting and covering at least a portion of the sidewall, and supporting the lower electrode LE1 (e.g., during manufacturing), a dielectric layer 160 on the lower electrode LE1 and the lower and upper supports 142P and 144P, and an upper electrode UE covering the dielectric layer 160 and separated from the lower electrode LE1 by the dielectric layer 160.

The lower electrode LE1 may include a base electrode layer 170 containing a halogen element 175 and an insertion layer 171 containing carbon 176. Descriptions of a component "containing" a particular element refers to that element being included in some form (e.g., as a compound or as the element alone) in the component. The insertion layer 171 may be inserted in a portion of the lower electrode LE1, which is adjacent to the lower and upper supports 142P and 144P and the dielectric layer 160. The structure and material of the lower electrode LE1 are described in detail below with reference to FIGS. 3B and 3C.

The insulating pattern 126P may be adjacent to a bottom portion of each of a plurality of lower electrodes LE1. Each of the lower electrodes LE1 may have a pillar shape, which extends lengthwise from the top surface of a conductive region 124 through an opening 126H of the insulating pattern 126P in a direction away from the substrate 110 in the vertical direction D3. An item, layer, or portion of an item or layer described as extending "lengthwise" in a particular direction has a length in the particular direction and a width perpendicular to that direction, where the length is greater than the width. The term "extending" is assumed to have the same meaning as "extending lengthwise" unless the context indicates otherwise. Although it is illustrated that each of the lower electrodes LE1 has a pillar shape, the inventive concept is not limited thereto. For example, each of the lower electrodes LE1 may have a cross-sectional structure having a cup shape or a cylinder shape with a closed bottom.

The lower electrodes LE1 may be supported by the lower support 142P and the upper support 144P. The lower electrodes LE1 may face the upper electrode UE with the dielectric layer 160 between the lower electrodes LE1 and the upper electrode UE. For example sidewalls of the lower electrodes LE1 may face sidewalls of the upper electrode UE, with the dielectric layer 160 formed therebetween.

The dielectric layer 160 may cover the lower electrodes LE1, the lower support 142P, and the upper support 144P. As shown in FIGS. 3A to 3C, when the insertion layer 171 is in contact with the lower support 142P, the upper support 144P, and the dielectric layer 160, the dielectric layer 160 may include portions contacting the insertion layer 171 of a lower electrode LE1, portions contacting the insulating pattern 126P, portions contacting the lower support 142P, and portions contacting the upper support 144P. The portions of the dielectric layer 160, which are in contact with the lower electrode LE1, may be separated from the base electrode layer 170 by the insertion layer 171, which is formed around and outside at least a part of the base electrode layer 170, for example to surround the base electrode layer 170. The term "contact," "contacting," "contacts," or "in contact with," as used in a verb form herein, refers to a direct connection (i.e., touching) unless the context clearly indicates otherwise. Also, each of the upper and lower support may be described as a support pattern, a support layer, or a support plate. The supports may be describe as having a sheet shape, or a plate shape.

As shown in FIG. 3A, the upper support 144P may surround a top portion of each of the lower electrodes LE1 and extend in parallel with the substrate 110. A plurality of holes 144H, through which the lower electrodes LE1 respectively pass, may be formed in the upper support 144P. The inner side wall of each of the holes 144H formed in the upper support 144P may be in contact with the outer side wall of a lower electrode LE1. The top surface of each of the lower electrodes LE1 may be coplanar with the top surface of the upper support 144P.

The lower support 142P may extend between the substrate 110 and the upper support 144P to be parallel with the substrate 110 and may be in contact with the outer side wall of each of the lower electrodes LE1. A plurality of holes 142H, through which the lower electrodes LE1 respectively pass, and a plurality of lower holes LH (see FIG. 9E) may be formed in the lower support 142P. The lower electrodes LE1 may pass through the holes 144H formed in the upper support 144P and the holes 142H formed in the lower support 142P and extend in the vertical direction D3.

FIG. 2 shows the plane structure of the upper support 144P and the lower electrodes LE1. As shown in FIG. 2, a plurality of upper holes UH may be formed in the upper support 144P. FIG. 2 illustrates a configuration, in which each of the upper holes UH substantially has a lozenge shape having four neighboring lower electrodes LE1 as vertexes in a plan view. However, the shape of each upper hole UH in a plan view is not limited to that shown in FIG. 2, and various changes and modifications may be made in embodiments. The lower electrodes LE1 may include portions protruding toward the center of the upper hole UH to a first point P. A plurality of lower holes LH (see FIG. 9E) having the same shape in a plan view as the upper holes UH may be formed in the lower support 142P.

The lower support 142P and the upper support 144P may include or be formed of an SiN film, an SiCN film, an SiBN film, or a combination thereof. In some embodiments, the lower support 142P may include or be formed of the same material as the upper support 144P. In some embodiments, the lower support 142P may include or be formed of a different material or combination of materials than the upper support 144P. For example, in one embodiment, the lower support 142P and the upper support 144P may be formed of SiCN. Alternatively, the lower support 142P may be formed of SiCN, and the upper support 144P may formed of SiBN. However, the inventive concept is not limited to those materials described above.

Each of the lower electrodes LE1 may include a metal-containing film including or formed of a first metal. The upper electrode UE may face each lower electrode LE1 with the dielectric layer 160 between the upper electrode UE and the lower electrode LE1. In some embodiments, the upper electrode UE may include or be formed of the first metal. In some embodiments, the upper electrode UE may include a metal different from the first metal.

Each of the lower electrode LE1 and the upper electrode UE may include or be formed of a conductive film such as a metal film, a conductive metal oxide film, a conductive metal nitride film, a conductive metal oxynitride film, or a combination thereof. In some embodiments, each of the lower electrode LE1 and the upper electrode UE may include Ti, Ti oxide, Ti nitride, Ti oxynitride, Nb, Nb oxide, Nb nitride, Nb oxynitride, Co, Co oxide, Co nitride, Co oxynitride, Sn, Sn oxide, Sn nitride, Sn oxynitride, or a combination thereof. For example, each of the lower electrode LE1 and the upper electrode UE may include NbN, TiN, CoN, $SnO_2$, or a combination thereof. In some embodiments, each of the lower electrode $LE_1$ and the upper electrode UE may include TaN, TiAlN, TaAlN, W, Ru, $RuO_2$, $SrRuO_3$, Ir, $IrO_2$, Pt, PtO, SRO($SrRuO_3$), BSRO(($Ba,Sr$)$RuO_3$), CRO($CaRuO_3$), LSCO(($La,Sr$)$CoO_3$), or a combination thereof. However, the materials of each of the lower electrode LE1 and the upper electrode UE are not limited to those described above. In particular, the lower electrode LE1 and the upper electrode UE may include a metal-containing film including the halogen element 175 and/or the carbon 176.

A horizontal dimension of the lower electrode LE1 and the horizontal and/or vertical dimension of the upper electrode UE may be about 1 nm to about 20 nm. In some embodiments, the horizontal dimension of the lower electrode LE1 and the horizontal and/or vertical dimension of the upper electrode UE may be greater than or equal to about 20 nm. In some embodiments, the horizontal dimension of the lower electrode LE1 may be greater than the horizontal and/or vertical dimension of the upper electrode UE. However, embodiments are not limited thereto. The horizontal dimension of the lower electrode LE1 may be less than or equal to the horizontal and/or vertical dimension of the upper electrode UE. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The dielectric layer 160 may include or be formed of a high-k dielectric layer. The term "high-k dielectric layer" used herein may refer to a dielectric layer having a higher dielectric constant than a silicon oxide film. In some embodiments, the dielectric layer 160 may include or be metal oxide including at least one metal selected from hafnium (Hf), zirconium (Zr), aluminum (Al), niobium (Nb), cerium (Ce), lanthanum (La), tantalum (Ta), and titanium (Ti). In some embodiments, the dielectric layer 160 may have a single-layer structure constituted of a single high-k dielectric layer. In some embodiments, the dielectric layer 160 may have a multi-layer structure including a plurality of high-k dielectric layers. The high-k dielectric layer may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof but is not limited thereto.

In some embodiments, the dielectric layer 160 may include at least one selected from a ferroelectric layer, an antiferroelectric layer, and a paraelectric layer. For example, the dielectric layer 160 may include $HfZrO_2$, $ZrO_2$, $PbTiO_3$, $AgNbO_3$, $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof but is not limited thereto.

In some embodiments, the dielectric layer 160 may include a multi-layer including a stack of a plurality of layers constituted of different materials from each other. For example, the dielectric layer 160 may include a first dielectric layer (not shown) contacting the lower electrode LE1 and a second dielectric layer (not shown) on the first dielectric layer.

The first dielectric layer may include a ferroelectric layer, an antiferroelectric layer, or a combination thereof. In some embodiments, the first dielectric layer may be constituted of a single layer, in which a ferroelectric material and an antiferroelectric material are non-uniformly mixed. In some embodiments, the first dielectric layer may be constituted of a single layer including a ferroelectric material. In some embodiments, the first dielectric layer may be constituted of a single layer including an antiferroelectric material. The second dielectric layer may be constituted of a paraelectric layer.

In some embodiments, the first dielectric layer may include $HfZrO_2$, $ZrO_2$, $PbTiO_3$, $AgNbO_3$, or a combination thereof. The second dielectric layer may include $HfO_2$, $ZrO_2$, $TiO_2$, $Ta_2O_3$, $VO_2$, $AlO_2$, $SiO_2$, $SrTiO_3$ $BaTiO_3$, $BiFeO_3$, or a combination thereof.

In some embodiments, the thickness of the dielectric layer 160 may be greater than 0 nm (e.g., at least 0.1 nm) and less than 6 nm. In some embodiments, the thickness of each of the first dielectric layer and the thickness of the second dielectric layer may be greater than 0 nm (e.g., at least 0.1 nm) and less than 3 nm. In some embodiments, the thickness of the first or second dielectric layer may be about 3 nm to about 6 nm but is not limited thereto.

Referring in detail to FIGS. 3A to 3C, the lower electrode LE1 may include the base electrode layer 170 containing the halogen element 175, and the insertion layer 171 containing the carbon 176. The insertion layer 171 may be inserted in a portion of the lower electrode LE1, which is adjacent to any one of the lower and upper supports 142P and 144P and the dielectric layer 160. Here, "the portion adjacent to" may be "a portion in contact with" and "a portion close to" though not in contact with. For example, the insertion layer 171 may be in contact with the lower and upper supports 142P and 144P and the dielectric layer 160 in the boundary between the lower electrode LE1 and the lower and upper supports 142P and 144P and the dielectric layer 160. In some embodiments, the insertion layer 171 may include a first portion 171a, which is in contact with the lower or upper support 142P or 144P in the boundary between the lower electrode LE1 and the lower or upper support 142P or 144P, and a second portion 171b, which is in contact with the dielectric layer 160 in the boundary between the lower electrode LE1 and the dielectric layer 160.

In some embodiments, in a plan view, the insertion layer 171 may be configured to be adjacent to any one of the lower and upper supports 142P and 144P and the dielectric layer 160 and surround the base electrode layer 170. In some embodiments, the base electrode layer 170 may extend in the vertical direction D3, i.e., a direction in which the lower electrode LE1 extends. The insertion layer 171 may surround the base electrode layer 170 and extend in the vertical direction D3, i.e., a direction in which the lower electrode LE1 and the base electrode layer 170 extend.

As shown in FIG. 3B, the insertion layer 171 may be in contact with the upper support 144P and the dielectric layer 160 in a region, i.e., the region P1 in FIG. 3A, in which the lower electrode LE1 is in contact with the upper support 144P and the dielectric layer 160. In this case, the insertion layer 171 may include the first portion 171a contacting the upper support 144P and the second portion 171b contacting the dielectric layer 160.

As shown in FIG. 3C, the insertion layer 171 may be in contact with the lower support 142P and the dielectric layer 160 in a region, i.e., the region P2 in FIG. 3A, in which the lower electrode LE1 is in contact with the lower support 142P and the dielectric layer 160. In this case, the insertion layer 171 may include the first portion 171a contacting the lower support 142P and the second portion 171b contacting the dielectric layer 160.

At a side LE1_S1 at which the lower electrode LE1 is in contact with the lower and upper supports 142P and 144P and the dielectric layer 160, first portions 171a of the insertion layer 171, each of which is in contact with the lower or upper support 142P or 144P, may alternate with second portions 171b of the insertion layer 171, each of which is in contact with the dielectric layer 160. At a side LE1_S2 at which the lower electrode LE1 is in contact with only the dielectric layer 160, the insertion layer 171 may include only the second portion 171b contacting the dielectric layer 160.

As shown in FIGS. 3A to 3C, when the insertion layer 171 is in contact with any one of the lower and upper supports 142P and 144P and the dielectric layer 160 in the boundary between the lower electrode LE1 and any one of the lower and upper supports 142P and 144P and the dielectric layer 160, the base electrode layer 170 may not be in contact with the lower and upper supports 142P and 144P and the dielectric layer 160. Therefore, the base electrode layer 170 may be separated by the insertion layer 171 from each of the lower and upper supports 142P and 144P and the dielectric layer 160 by the thickness of the insertion layer 171.

The insertion layer 171 may include the carbon 176. In detail, the insertion layer 171 may be formed from a precursor, which contains non-halogenated metal, in an environment with no precursor containing halogenated metal. The insertion layer 171 may therefore consist of a material formed from a precursor that does not include a halogen element. The precursor containing non-halogenated metal may include a metallic glass precursor. In some embodiments, the precursor may include at least one selected from metal, the carbon 176, hydrogen, and nitrogen. For example, when the insertion layer 171 includes TiN, the insertion layer 171 may be formed using $TiCH_4$, so that the insertion layer 171 includes C-containing TiN.

The base electrode layer 170 may contain the halogen element 175. For example, the base electrode layer 170 may contain Cl. In detail, when the base electrode layer 170 includes TiN, the base electrode layer 170 may be formed using $TiCl_4$ as a halogenated Ti-containing precursor. When the base electrode layer 170 is formed using $TiCl_4$ as a precursor, the base electrode layer 170 may include Cl-containing TiN. The different precursors may be used at different times to form different layers, such as the insertion layer 171 and the base electrode layer 170, that have different elements or materials mixed in with a primary conductive material.

In some embodiments, the horizontal dimension of the lower electrode LE1 may be about 1 nm to about 20 nm. In some embodiments, the horizontal dimension of the lower electrode LE1 may be greater than or equal to about 20 nm. According to embodiments, when the horizontal dimension of the lower electrode LE1 is less than about 20 nm, the insertion layer 171 may surround the base electrode layer 170. In a plan view, a horizontal dimension L2 (e.g., horizontal diameter or horizontal width) of the base electrode layer 170 may result from subtracting a total horizontal dimension of the insertion layer 171 (e.g., horizontal thickness of a sidewall of the insertion layer 171 times two) from the horizontal dimension of the lower electrode LE1 (e.g., total diameter of the lower electrode LE1). For example, when the horizontal dimension of the lower electrode LE1 is less than 20 nm and a horizontal dimension L1 of the insertion layer 171 is 0.5 nm, the horizontal dimension L2 of the base electrode layer 170 surrounded by the insertion layer 171 may be less than 19 nm. Alternatively, the lower electrode LE1 may include the base electrode layer 170 and the insertion layer 171, the horizontal dimension L2 of the base electrode layer 170 may be about 1 nm to about 20 nm, and the horizontal dimension L1 of the insertion layer 171 may be about 0.25 nm to about 5 nm. In this case, the horizontal dimension of the lower electrode LE1 may be greater than or equal to about 20 nm.

In some embodiments, a ratio of the horizontal dimension L1 of the insertion layer 171 to the horizontal dimension L2 of the base electrode layer 170 may be less than or equal to about ¼. For example, the horizontal dimension L1 (e.g., thickness) of the insertion layer 171 may be less than or equal to ¼ of the horizontal dimension L2 (e.g., diameter or horizontal thickness) of the base electrode layer 170. For example, when the horizontal dimension L2 of the base electrode layer 170 is about 20 nm, the horizontal dimension L1 of the insertion layer 171 may be less than about 5 nm.

In some embodiments, the concentration of the carbon 176 in the insertion layer 171 may be greater than or equal to 0.5 atom % and less than or equal to about 10 atom %. For example, the concentration of the carbon 176 in the insertion layer 171 may be greater than or equal to 1.5 atom % and less than or equal to about 10 atom %. For example, the concentration of the carbon 176 in the insertion layer 171 may be greater than or equal to 3 atom % and less than or equal to about 10 atom %. For example, the concentration of the carbon 176 in the insertion layer 171 may be greater than or equal to 4.5 atom % and less than or equal to about 10 atom %. For example, the concentration of the carbon 176 in the insertion layer 171 may be greater than or equal to 5 atom % and less than or equal to about 10 atom %. For example, the concentration of the carbon 176 in the insertion layer 171 may be greater than or equal to 7 atom % and less than or equal to about 10 atom %. In some embodiments, the concentration of the halogen element 175 in the base electrode layer 170 may be greater than 0 atom % (e.g., at least 0.1 atom %) and less than or equal to about 10 atom %. For example, the concentration of chlorine in the base electrode layer 170 may be greater than 0 atom % (e.g., at least 0.1 atom %) and less than or equal to about 10 atom %. The concentration of certain elements within a particular layer or region as described herein refers to an average concentration within that layer or region.

In some embodiments, the insertion layer 171 may further contain the halogen element 175 in addition to the carbon 176. In this case, the insertion layer 171 may be formed from a precursor containing halogenated metal and a precursor containing non-halogenated metal. When the insertion layer 171 contains the halogen element 175, the concentration of the halogen element 175 in the insertion layer 171 may be less than the concentration of the carbon 176 in the insertion layer 171 and/or the concentration of the halogen element 175 in the base electrode layer 170. For example, when the concentration of the carbon 176 in the insertion layer 171 is about 7 atom % and the concentration of the halogen element 175 in the base electrode layer 170 is about 7 atom %, the concentration of the halogen element 175 in the insertion layer 171 may be less than about 7 atom %, for example, may be about 3 atom %.

In some embodiments, the base electrode layer 170 may further contain the carbon 176 in addition to the halogen element 175. When the base electrode layer 170 contains the carbon 176, the concentration of the carbon 176 in the base electrode layer 170 may be less than the concentration of the halogen element 175 in the base electrode layer 170 and/or the concentration of the carbon 176 in the insertion layer 171. For example, when the concentration of the halogen element 175 in the base electrode layer 170 is about 7 atom % and the concentration of the carbon 176 in the insertion layer 171 is about 7 atom %, the concentration of the carbon 176 in the base electrode layer 170 may be less than about 7 atom %, for example, may be about 3 atom %.

As described above, the insertion layer 171 may contain the carbon 176. In some embodiments, the concentration of the carbon 176 in the insertion layer 171 may be non-uniform in a horizontal direction. For example, the carbon 176 may be non-uniformly distributed in the insertion layer 171. For example, the concentration of the carbon 176 in the insertion layer 171 may be highest in a portion of the insertion layer 171, which is adjacent to the lower or upper support 142P or 144P or the dielectric layer 160, and lowest in a portion of the insertion layer 171, which is adjacent to the base electrode layer 170. Here, "the portion adjacent to" may be "a portion in contact with" and "a portion close to" though not in contact with. For example, the concentration of the carbon 176 in the insertion layer 171 may be highest at the boundary between the insertion layer 171 and the lower or upper support 142P or 144P or the dielectric layer 160, may decrease toward the base electrode layer 170, and may be lowest at the boundary between the insertion layer 171 and the base electrode layer 170. The concentration of the carbon 176 in the insertion layer 171 may be higher near the boundary between the insertion layer 171 and the lower or upper support 142P or 144P or the dielectric layer 160 than at the boundary between the insertion layer 171 and the base electrode layer 170. The concentration of the carbon 176 in the insertion layer 171 may be highest near the boundary between the insertion layer 171 and the base electrode layer 170.

When the base electrode layer 170 contains the carbon 176, the concentration of the carbon 176 in the base electrode layer 170 may be non-uniform in the horizontal direction. Therefore, the carbon 176 may be non-uniformly distributed in the base electrode layer 170.

In some embodiments, the base electrode layer 170 may not contain the carbon 176, or the concentration of the carbon 176 in the base electrode layer 170 may be less than the concentration of the carbon 176 in the insertion layer 171 even when the base electrode layer 170 contains the carbon 176, and accordingly, the concentration of the carbon 176 in the lower electrode LE1 may be highest in the insertion layer 171. The concentration of the carbon 176, which is highest in the insertion layer 171, may non-uniformly decrease away from a position at which the concentration of the carbon 176 in the insertion layer 171 is highest. The concentration and distribution of the carbon 176 are not limited to those described above.

The insertion layer 171 containing the carbon 176 may surround the base electrode layer 170 containing the halogen element 175, and accordingly, the insertion layer 171 may function as a barrier for the base electrode layer 170 during a process of manufacturing the semiconductor device 100. When the insertion layer 171 includes a metal-containing film containing the carbon 176, the insertion layer 171 may have a higher oxidation resistance than a metal-containing film without the carbon 176, e.g., a metal-containing film containing the halogen element 175. In other words, the insertion layer 171 including a metal-containing film including the carbon 176 may be more resistant to oxidation than a metal-containing film that does not include the carbon 176. For example, in a process of manufacturing the semiconductor device 100, a mold (e.g., a first mold pattern 132P and a second mold pattern 134P in FIG. 9D) may be removed by wet processing. When the insertion layer 171 containing the carbon 176 is inserted into the lower electrode LE1 and surrounds the base electrode layer 170, loss of the base electrode layer 170, which may occur during a wet removal process, may be reduced. As the loss of the base electrode layer 170 is reduced, failure caused by bending of an electrode may be reduced in subsequent processes.

Figure 4A:
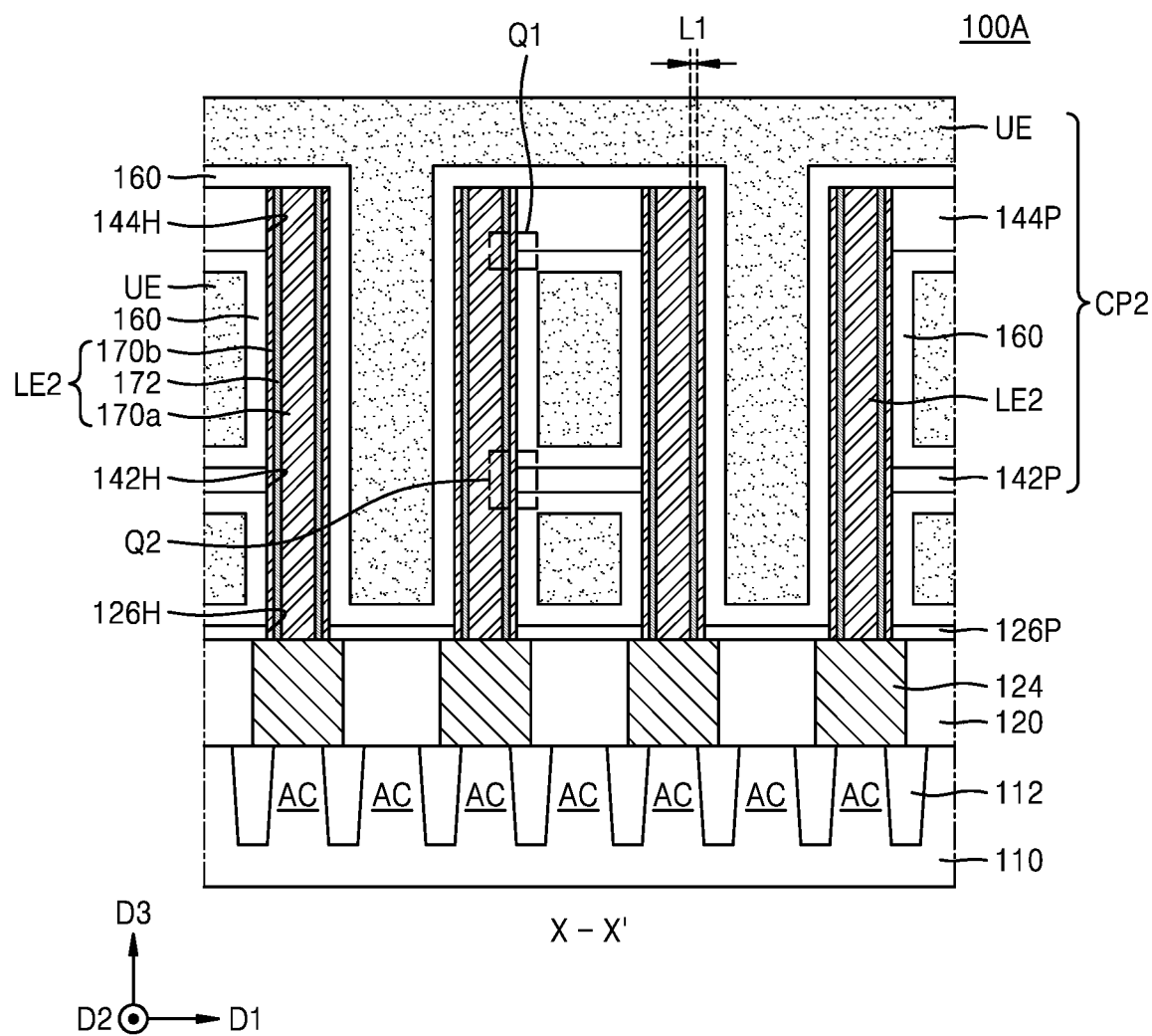
FIG. 4A is a cross-sectional view of the structure of a semiconductor device, according to embodiments.
Figure 4B:
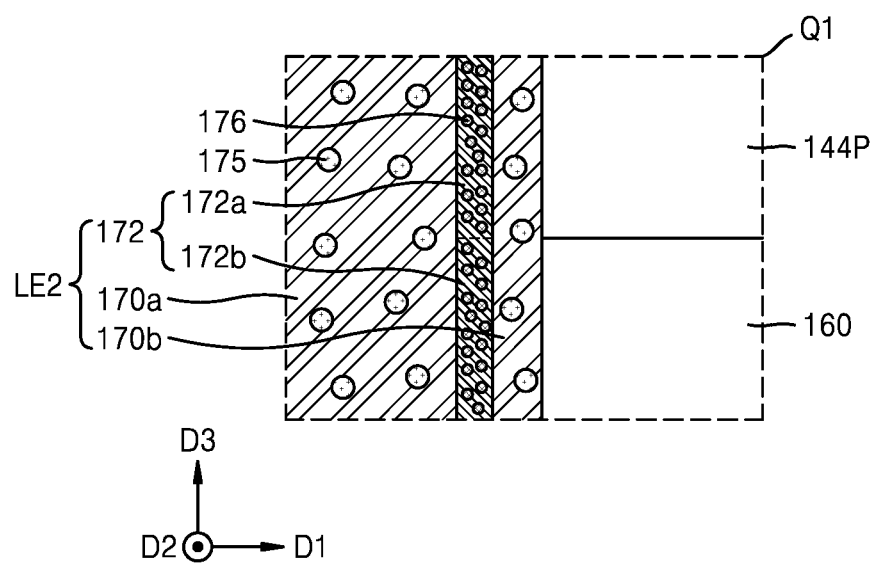
FIGS. 4B and 4C are enlarged cross-sectional views of regions Q1 and Q2, respectively, in FIG. 4A.
Figure 4C:
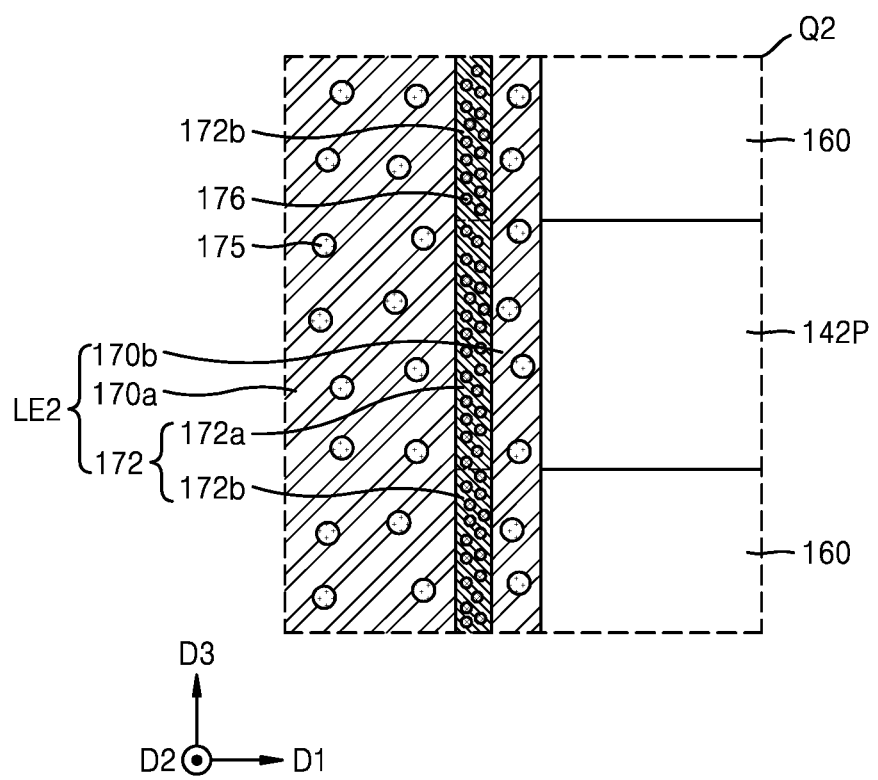

FIG. 4A is a cross-sectional view of the structure of a semiconductor device 100A, according to embodiments. FIGS. 4B and 4C are enlarged cross-sectional views of regions Q1 and Q2, respectively, in FIG. 4A.

Referring to FIGS. 4A to 4C, a plurality of capacitors CP2 may be arranged above the substrate 110. Each of the capacitors CP2 may include a lower electrode LE2 extending in a direction (i.e., the vertical direction D3) perpendicular to the top surface of the substrate 110, the lower and upper supports 142P and 144P surrounding the side wall of the lower electrode LE2 and supporting the lower electrode LE2, the dielectric layer 160 on the lower electrode LE2 and the lower and upper supports 142P and 144P, and the upper electrode UE covering the dielectric layer 160 and separated from the lower electrode LE2 by the dielectric layer 160.

The lower electrode LE2 may include the base electrode layer 170 containing the halogen element 175 and an insertion layer 172 containing the carbon 176. The insertion layer 172 may be inserted in a portion of the lower electrode LE2, which is adjacent to the lower and upper supports 142P and 144P and the dielectric layer 160. Here, "the portion adjacent to" may be "a portion in contact with" and "a portion close to" though not in contact with. For example, the insertion layer 172 may be inserted in the base electrode layer 170 to be close to the lower and upper supports 142P and 144P and the dielectric layer 160 without contacting the lower and upper supports 142P and 144P and the dielectric layer 160. In this case, the base electrode layer 170 may be in contact with the lower and upper supports 142P and 144P and the dielectric layer 160.

In some embodiments, the base electrode layer 170 may include a first base electrode layer 170a, which is not in contact with the lower and upper supports 142P and 144P and the dielectric layer 160, and a second base electrode layer 170b, which is in contact with the lower and upper supports 142P and 144P and the dielectric layer 160. In a plan view, the second base electrode layer 170b may surround the first base electrode layer 170a. In some embodiments, the base electrode layer 170 may extend in the extension direction of the lower electrode LE2, i.e., the vertical direction D3 perpendicular to the top surface of the substrate 110. The first base electrode layer 170a and the second base electrode layer 170b may extend in the extension direction of the base electrode layer 170, i.e., the vertical direction D3.

The insertion layer 172 may be inserted between the first base electrode layer 170a and the second base electrode layer 170b and may be adjacent to any one of the lower and upper supports 142P and 144P and the dielectric layer 160 with the second base electrode layer 170b between the insertion layer 172 and any one of the lower and upper supports 142P and 144P and the dielectric layer 160. In a plan view, the insertion layer 172 may surround the first base electrode layer 170a and extend along the first base electrode layer 170a, and the second base electrode layer 170b may surround the insertion layer 172 and extend along the insertion layer 172.

In some embodiments, the insertion layer 172 may include a first portion 172a adjacent to any one of the lower and upper supports 142P and 144P and a second portion 172b adjacent to the dielectric layer 160. For example, the first portion 172a of the insertion layer 172 may be in contact with a portion of the second base electrode layer 170b, which is in contact with the lower or upper support 142P or 144P at the boundary between the lower electrode LE2 and the lower or upper support 142P or 144P, and may be adjacent to the lower or upper support 142P or 144P with the portion of the second base electrode layer 170b between the first portion 172a and the lower or upper support 142P or 144P. For example, the second portion 172b of the insertion layer 172 may be in contact with another portion of the second base electrode layer 170b, which is in contact with the dielectric layer 160 at the boundary between the lower electrode LE2 and the dielectric layer 160, and may be adjacent to the dielectric layer 160 with the portion of the second base electrode layer 170b between the second portion 172b and the dielectric layer 160.

As shown in FIG. 4B, the insertion layer 172 may be adjacent to the upper support 144P and the dielectric layer 160 in a region, i.e., the region Q1 in FIG. 4A, in which the lower electrode LE2 is in contact with the upper support 144P and the dielectric layer 160. In this case, the insertion layer 172 may include the first portion 172a adjacent to the upper support 144P and the second portion 172b adjacent to the dielectric layer 160.

As shown in FIG. 4C, the insertion layer 172 may be adjacent to the lower support 142P and the dielectric layer 160 in a region, i.e., the region Q2 in FIG. 4A, in which the lower electrode LE2 is in contact with the lower support 142P and the dielectric layer 160. In this case, the insertion layer 172 may include the first portion 172a adjacent to the lower support 142P and the second portion 172b adjacent to the dielectric layer 160.

The insertion layer 172 may contain the carbon 176. In detail, the insertion layer 172 may be formed from a precursor, which contains non-halogenated metal, in an environment with no precursor containing halogenated metal. Descriptions of the insertion layer 172 may be the same as or similar to those of the insertion layer 171 given above.

The first base electrode layer 170a and the second base electrode layer 170b may contain the halogen element 175. For example, the first base electrode layer 170a and/or the second base electrode layer 170b may contain Cl. Descriptions of the first and second base electrode layers 170a and 170b may be the same as or similar to those of the base electrode layer 170 given above.

In some embodiments, a horizontal dimension of the lower electrode LE2 may be about 1 nm to about 20 nm. In some embodiments, the horizontal dimension of the lower electrode LE2 may be greater than or equal to about 20 nm. A horizontal dimension of the second base electrode layer 170b may be less than a horizontal dimension of the first base electrode layer 170a. The horizontal dimension of the second base electrode layer 170b may be less than or substantially equal to a horizontal dimension of the insertion layer 172. In some embodiments, the horizontal dimension of the second base electrode layer 170b may be greater than the horizontal dimension of the insertion layer 172. The horizontal dimension L1 of the insertion layer 172 may be about 0.25 nm to about 5 nm and less than or equal to ¼ of a horizontal dimension of the base electrode layer 170. The horizontal dimension of the base electrode layer 170 may include the horizontal width of the first base electrode layer 170a added to twice the thickness of the second base electrode layer 170b.

In some embodiments, the concentration of the carbon 176 in the insertion layer 172 may be greater than or equal to 0.5 atom % and less than or equal to about 10 atom %. For example, the concentration of the carbon 176 in the insertion layer 172 may be greater than or equal to 1.5 atom % and less than or equal to about 10 atom %. For example, the concentration of the carbon 176 in the insertion layer 172 may be greater than or equal to 3 atom % and less than or equal to about 10 atom %. For example, the concentration of the carbon 176 in the insertion layer 172 may be greater than or equal to 4.5 atom % and less than or equal to about 10 atom %. For example, the concentration of the carbon 176 in the insertion layer 172 may be greater than or equal to 5 atom % and less than or equal to about 10 atom %. For example, the concentration of the carbon 176 in the insertion layer 172 may be greater than or equal to 7 atom % and less than or equal to about 10 atom %. In some embodiments, the concentration of the halogen element 175 in each of the first and second base electrode layers 170a and 170b may be greater than 0 atom % and less than or equal to about 10 atom %. For example, the concentration of chlorine in each of the first and second base electrode layers 170a and 170b may be greater than 0 atom % and less than or equal to about 10 atom %.

In some embodiments, the insertion layer 172 may further contain the halogen element 175 in addition to the carbon 176. In this case, the insertion layer 172 may be formed from a precursor containing halogenated metal and a precursor containing non-halogenated metal. When the insertion layer 172 contains the halogen element 175, the concentration of the halogen element 175 in the insertion layer 172 may be less than the concentration of the carbon 176 in the insertion layer 172 and/or the concentration of the halogen element 175 in the base electrode layer 170.

In some embodiments, the first base electrode layer 170a and/or the second base electrode layer 170b may further contain the carbon 176 in addition to the halogen element 175. When the first base electrode layer 170a and/or the second base electrode layer 170b contains the carbon 176, the concentration of the carbon 176 in the first base electrode layer 170a and/or the second base electrode layer 170b may be less than the concentration of the halogen element 175 in the first base electrode layer 170a and/or the second base electrode layer 170b and/or the concentration of the carbon 176 in the insertion layer 172.

As described above, the insertion layer 172 may contain the carbon 176. In some embodiments, the concentration of the carbon 176 in the insertion layer 172 may be non-uniform in the horizontal direction. In other words, the carbon 176 may be non-uniformly distributed in the insertion layer 172. For example, the concentration of the carbon 176 in the insertion layer 172 may be highest at a position in the insertion layer 172 and may decrease toward the first base electrode layer 170a and second base electrode layer 170b.

When the first base electrode layer 170a and/or the second base electrode layer 170b contains the carbon 176, the concentration of the carbon 176 in the first base electrode layer 170a and/or the second base electrode layer 170b may be non-uniform in the horizontal direction. Therefore, the carbon 176 may be non-uniformly distributed in the first base electrode layer 170a and/or the second base electrode layer 170b.

When the insertion layer 172 containing the carbon 176 is inserted between the first base electrode layer 170a and the second base electrode layer 170b in the lower electrode LE2, loss of the base electrode layer 170 during a wet removal process may be reduced.

Figure 5A:
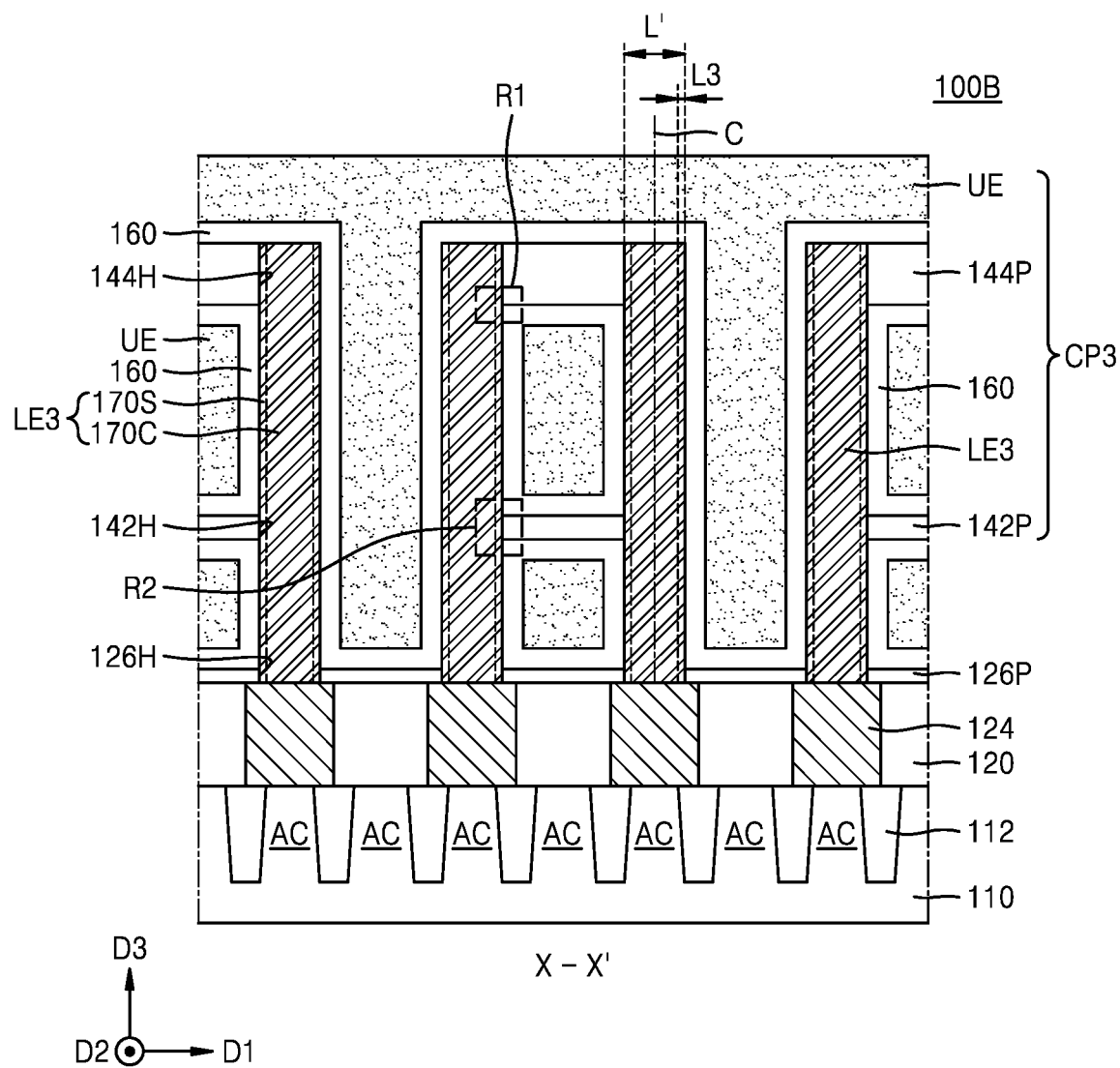
FIG. 5A is a cross-sectional view of the structure of a semiconductor device, according to embodiments.
Figure 5B:
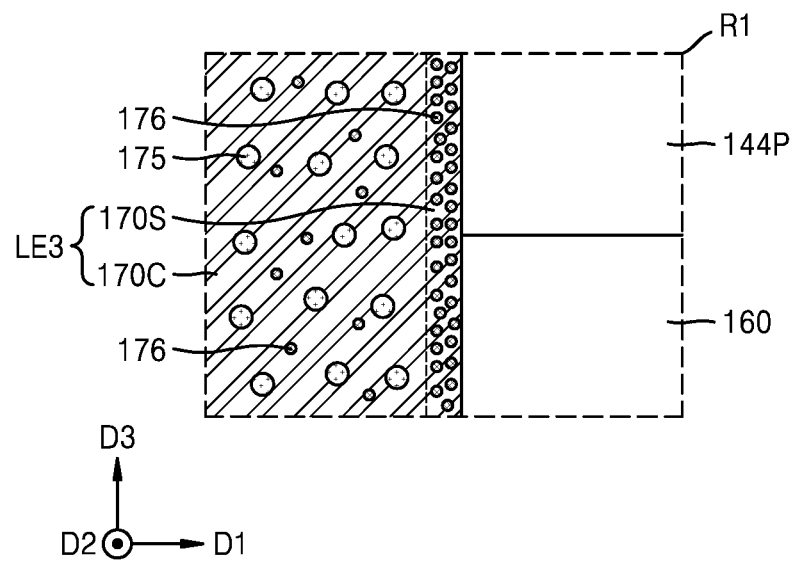
FIGS. 5B and 5C are enlarged cross-sectional views of regions R1 and R2, respectively, in FIG. 5A.
Figure 5C:
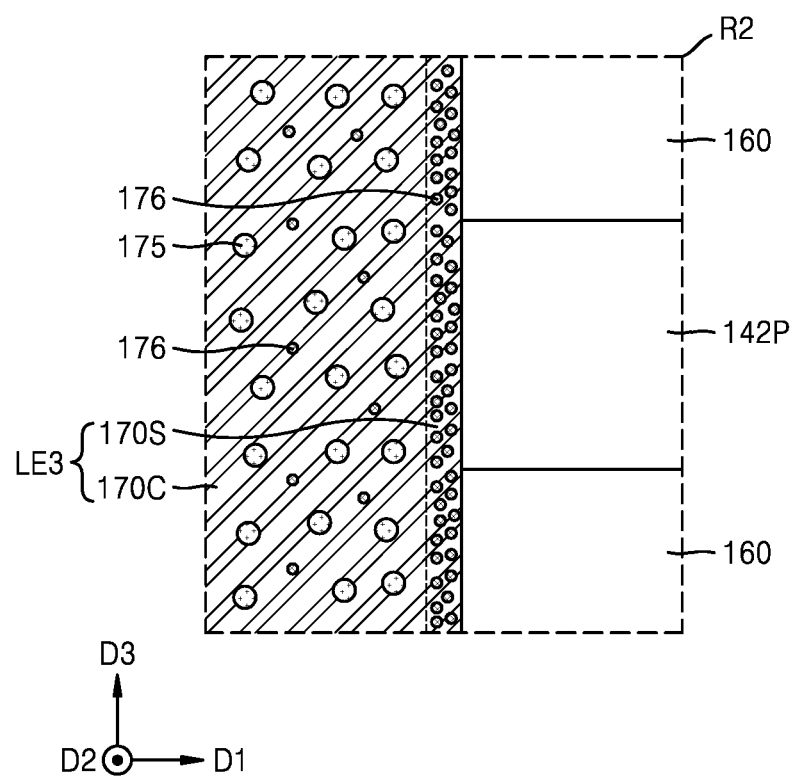
Figure 5D:
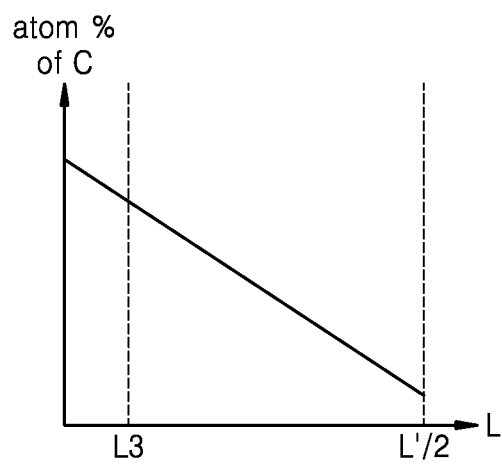
FIGS. 5D and 5E are graphs showing a carbon composition ratio with respect to a distance between the boundary of a component of the semiconductor device of FIG. 5A and a position in the component.
Figure 5E:
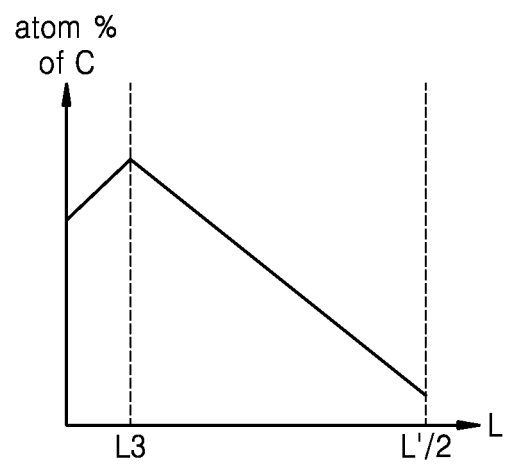

FIG. 5A is a cross-sectional view of the structure of a semiconductor device 100B, according to embodiments. FIGS. 5B and 5C are enlarged cross-sectional views of regions R1 and R2, respectively, in FIG. 5A. FIGS. 5D and 5E are graphs showing a carbon composition ratio with respect to a distance L between a position in a component of the semiconductor device 100B of FIG. 5A and the boundary between the component and any one of the lower and upper supports 142P and 144P and the dielectric layer 160.

Referring to FIGS. 5A to 5C, a plurality of capacitors CP3 may be arranged above the substrate 110. Each of the capacitors CP3 may include a lower electrode LE3 extending in the vertical direction D3, the lower and upper supports 142P and 144P surrounding the side wall of the lower electrode LE3 and supporting the lower electrode LE3, the dielectric layer 160 on the lower electrode LE3 and the lower and upper supports 142P and 144P, and the upper electrode UE covering the dielectric layer 160 and separated from the lower electrode LE3 by the dielectric layer 160.

The lower electrode LE3 may include the base electrode layer 170, which contains the halogen element 175, and the carbon 176 distributed in the base electrode layer 170. The base electrode layer 170 may include a periphery 170S and a core 170C. The periphery 170S includes a portion directly adjacent to any one of the lower and upper supports 142P and 144P and the dielectric layer 160 and extends in the vertical direction D3. The core 170C includes a portion, which is not directly adjacent to any one of the lower and upper supports 142P and 144P and the dielectric layer 160, and extends in the vertical direction D3. In a plan view, the periphery 170S may surround the core 170C.

In some embodiments, a horizontal dimension L' of the lower electrode LE3 may be about 1 nm to about 20 nm. In some embodiments, the horizontal dimension L' of the lower electrode LE3 may be greater than or equal to about 20 nm. In some embodiments, a horizontal dimension L3 of the periphery 170S may be about 0.25 nm to about 5 nm, and a horizontal dimension of the core 170C may result from subtracting twice the horizontal dimension L3 of the periphery 170S from the horizontal dimension L' of the lower electrode LE3. In some embodiments, a ratio of the horizontal dimension L3 of the periphery 170S to the horizontal dimension L' of the lower electrode LE3 may be less than or equal to about ¼. In other words, the horizontal dimension L3 of the periphery 170S may be less than or equal to ¼ of the horizontal dimension L' of the lower electrode LE3.

In some embodiments, the concentration of the carbon 176 in the lower electrode LE3 may be higher in the periphery 170S than in the core 170C. Referring to FIGS. 5D and 5E, the concentration of the carbon 176 in the lower electrode LE3 may decrease away from when a distance from a position in the lower electrode LE3 to the boundary between the lower electrode LE3 and any one of the lower and upper supports 142P and 144P and the dielectric layer 160 is 0 toward when a distance from a position in the lower electrode LE3 to the boundary between the lower electrode LE3 and any one of the lower and upper supports 142P and 144P and the dielectric layer 160 is L'/2. For example, the concentration of the carbon 176 in the lower electrode LE3 may decrease away from the boundary between the lower electrode LE3 and any one of the lower and upper supports 142P and 144P and the dielectric layer 160 toward a central line C of the lower electrode LE3. In some embodiments, the concentration of the carbon 176 in the lower electrode LE3 may decrease away from the boundary of the lower electrode LE3, as shown in FIG. 5D, or may increase to a certain position in the lower electrode LE3 and then decrease away therefrom.

In some embodiments, as shown in FIG. 5D, the concentration of the carbon 176 in the lower electrode LE3 may be highest in the periphery 170S at the boundary between the lower electrode LE3 and any one of the lower and upper supports 142P and 144P and the dielectric layer 160. When the concentration of the carbon 176 in the lower electrode LE3 is highest at the boundary between the lower electrode LE3 and any one of the lower and upper supports 142P and 144P and the dielectric layer 160, the concentration of the carbon 176 may decrease away from the boundary. The concentration of the carbon 176 in the lower electrode LE3 may regularly or irregularly decrease away from the boundary of the lower electrode LE3. Even when the concentration of the carbon 176 in the lower electrode LE3 is highest at the boundary between the lower electrode LE3 and any one of the lower and upper supports 142P and 144P and the dielectric layer 160, the concentration of the carbon 176 may not constantly decrease but decrease and then increase and finally decrease away from the boundary. Also, in one embodiment of FIG. 5D, the periphery 170S does not include any halogen elements, and after the boundary between the periphery 170S and the core 170C, halogen elements are included.

In some embodiments, as shown in FIG. 5E, the concentration of the carbon 176 in the lower electrode LE3 may be highest in the periphery 170S at the boundary between the periphery 170S and the core 170C. In this embodiment, the boundary between the periphery 170S and the core 170C may be defined by the horizontal distance, within the lower electrode LE3 from the boundary with the upper supports 142P and 144P and the dielectric layer 160, where the carbon concentration 176 is the highest. This may correspond to a region where a peak (maximum) amount of precursor including carbon is used when forming the lower electrode LE3. In other embodiments, such as in FIG. 5D above, the boundary may correspond to a circumferential planar surface where a type of precursor material was changed during formation of the lower electrode LE3. When the concentration of the carbon 176 in the lower electrode LE3 is highest in the boundary between the core 170C and the periphery 170S, the concentration of the carbon 176 may decrease away from the boundary therebetween. In other words, the concentration of the carbon 176 in the periphery 170S may be highest in the boundary between the periphery 170S and the core 170C and may decrease away from the boundary therebetween. The concentration of the carbon 176 in the core 170C may be highest in the boundary between the core 170C and the periphery 170S and may decrease away from the boundary therebetween. The concentration of the carbon 176 may regularly or irregularly decrease away from the boundary between the periphery 170S and the core 170C. Even when the concentration of the carbon 176 in the lower electrode LE3 is highest in the periphery 170S in the boundary between the periphery 170S and the core 170C, the concentration of the carbon 176 in the lower electrode LE3 may not constantly decrease but decrease and then increase and finally decrease away from the boundary.

In some embodiments, the concentration of the carbon 176 in the periphery 170S may be greater than 0 atom % and less than or equal to about 10 atom %. Because the concentration of the carbon 176 in the lower electrode LE3 is higher in the periphery 170S than in the core 170C, the concentration of the carbon 176 in the lower electrode LE3 may be greater than 0 atom % and less than or equal to about 10 atom %.

In some embodiments, the concentration of the halogen element 175 in the base electrode layer 170 may be greater than 0 atom % and less than or equal to about 10 atom %. The concentration of the halogen element 175 in the base electrode layer 170 may be higher in the core 170C than in the periphery 170S. Therefore, even when each of the periphery 170S and the core 170C includes both the carbon 176 and the halogen element 175, the concentration of the halogen element 175 may be higher than the concentration of the carbon 176 in the core 170C, and the concentration of the carbon 176 may be higher than the concentration of the halogen element 175 in the periphery 170S. In some embodiments, the concentration of the halogen element 175 may be higher than the concentration of the carbon 176 in both the core 170C and the periphery 170S. Even when the concentration of the halogen element 175 is lower than the concentration of the carbon 176 in both the core 170C and the periphery 170S, a ratio of the concentration of the carbon 176 to the concentration of the halogen element 175 may be higher in the periphery 170S than in the core 170C because the concentration of the carbon 176 in the periphery 170S is higher than the concentration of the carbon 176 in the core 170C.

Figure 6:
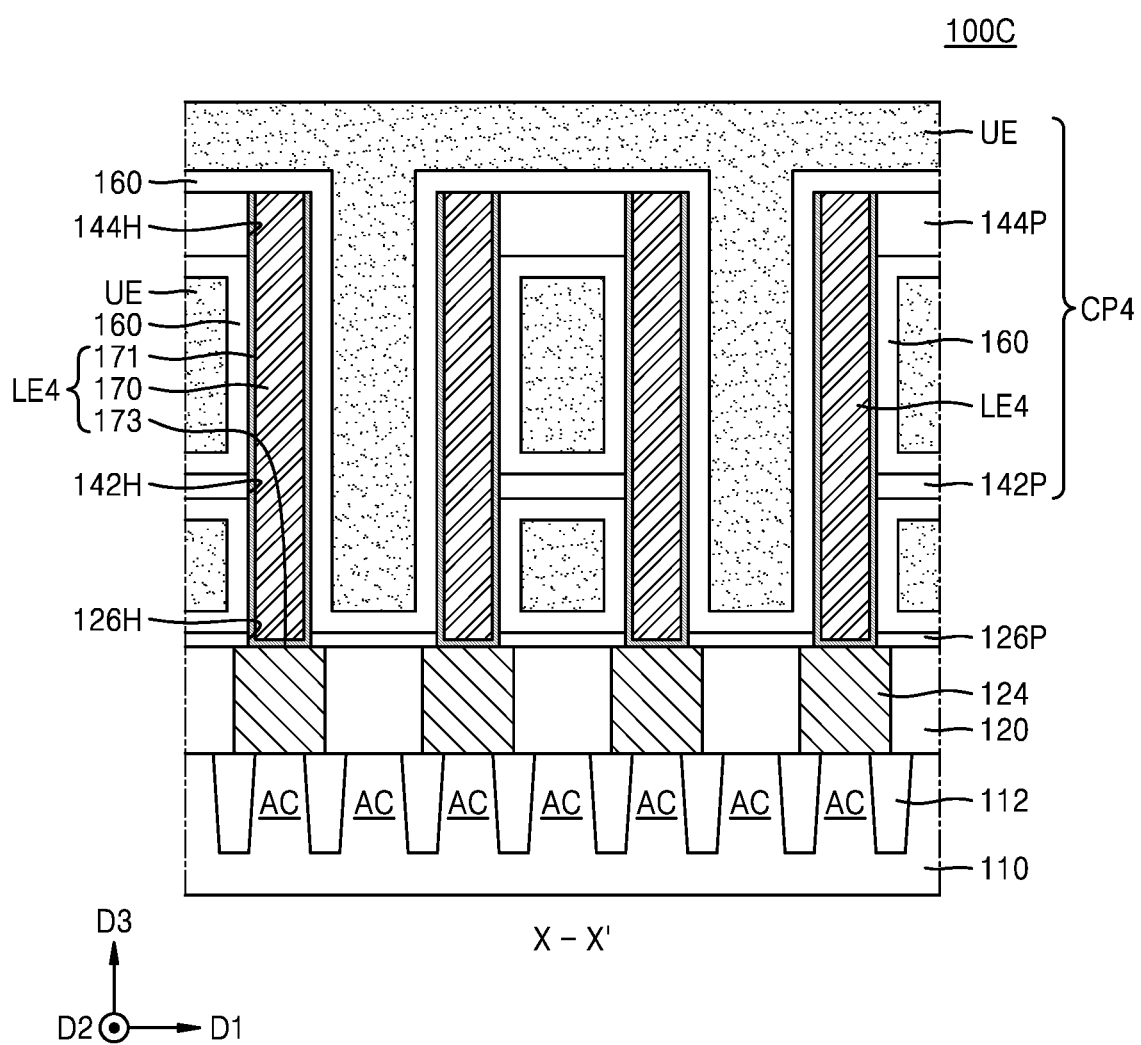
FIGS. 6 to 8 are cross-sectional views of the structures of semiconductor devices, according to embodiments.
Figure 7:
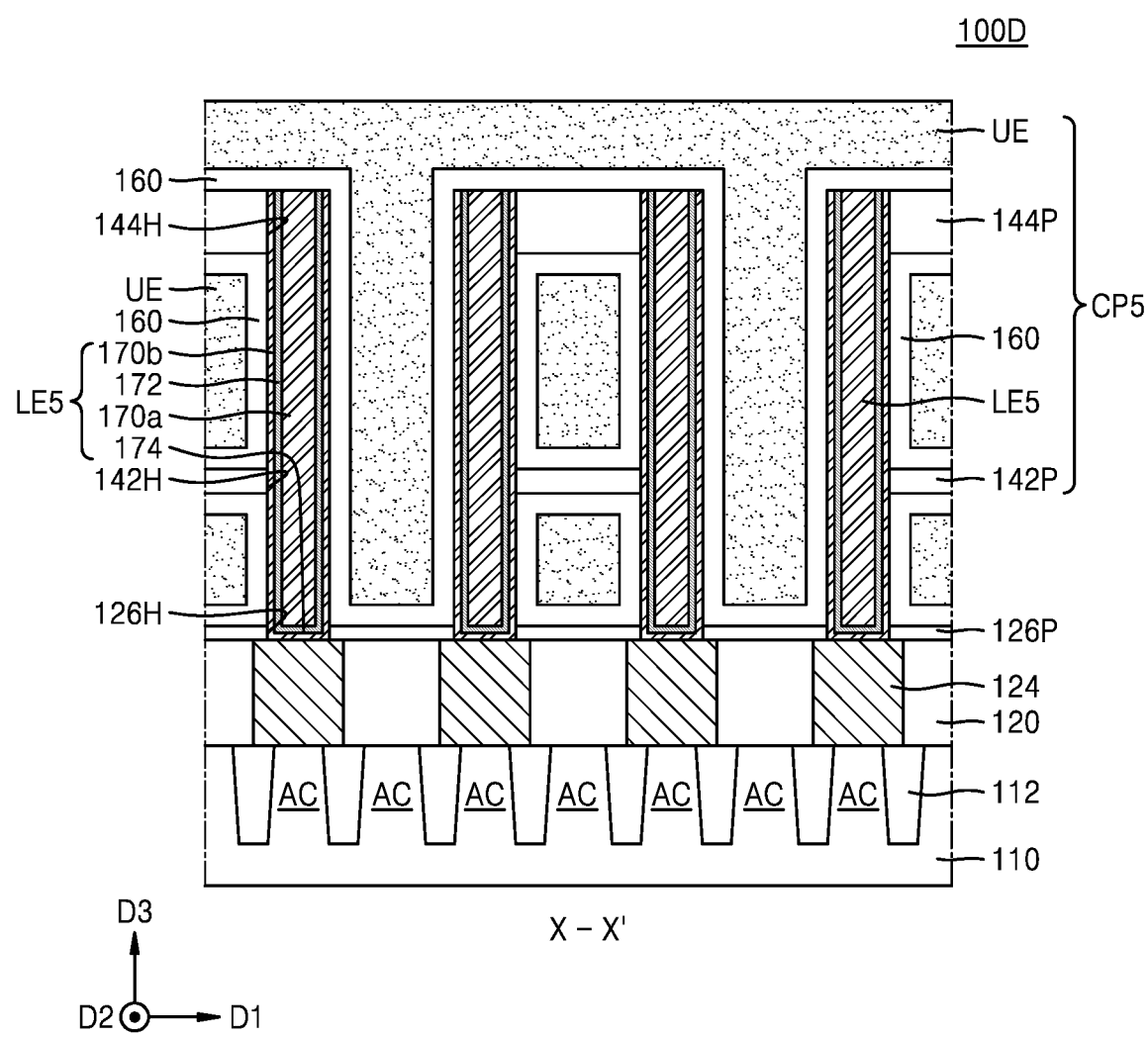
Figure 8:
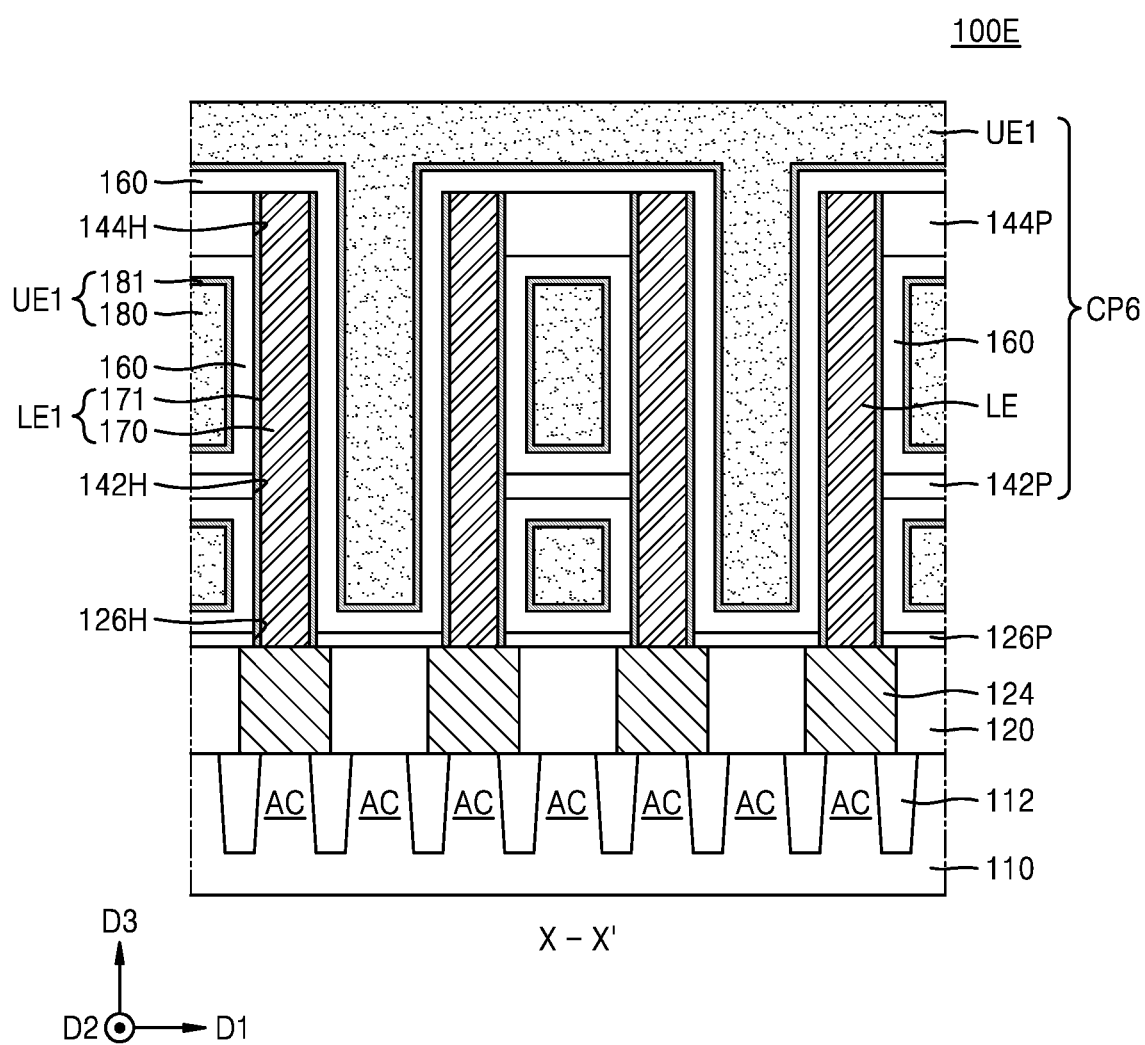

FIGS. 6 to 8 are cross-sectional views of the structures of semiconductor devices, according to embodiments.

Referring to FIG. 6, a semiconductor device 100C may include a plurality of capacitors CP4. Each of the capacitors CP4 may include the substrate 110, a lower electrode LE4 which is above the substrate 110 and extends in the vertical direction D3, the lower and upper supports 142P and 144P surrounding the side wall of the lower electrode LE4 and supporting the lower electrode LE4, the dielectric layer 160 on the lower electrode LE4 and the lower and upper supports 142P and 144P, and the upper electrode UE covering the dielectric layer 160 and separated from the lower electrode LE4 by the dielectric layer 160. The lower electrode LE4 may include the base electrode layer 170 containing the halogen element 175 and the insertion layer 171 containing the carbon 176. The insertion layer 171 may be inserted in a portion of the lower electrode LE4, which is adjacent to the lower and upper supports 142P and 144P and the dielectric layer 160. The insertion layer 171 may include a horizontal extension 173, which is above the substrate 110 and extends in the first direction D1. The horizontal extension 173 may be formed by applying a carbon-containing material, e.g., metal nitride, to the bottom of each of a plurality of holes BH (see FIG. 9C) when a source is filled in the holes BH in a process of forming the lower electrode LE4.

Referring to FIG. 7, a semiconductor device 100D may include a plurality of capacitors CP5. Each of the capacitors CP5 may include the substrate 110, a lower electrode LE5 which is above the substrate 110 and extends in the vertical direction D3, the lower and upper supports 142P and 144P surrounding the side wall of the lower electrode LE5 and supporting the lower electrode LE5, the dielectric layer 160 on the lower electrode LE5 and the lower and upper supports 142P and 144P, and the upper electrode UE covering the dielectric layer 160 and separated from the lower electrode LE5 by the dielectric layer 160. The lower electrode LE5 may include the base electrode layer 170 containing the halogen element 175 and the insertion layer 172 containing the carbon 176. The insertion layer 172 may be inserted in a portion of the lower electrode LE5, which is adjacent to the lower and upper supports 142P and 144P and the dielectric layer 160. In some embodiments, the base electrode layer 170 may include the first base electrode layer 170a, which is not in contact with the lower and upper supports 142P and 144P and the dielectric layer 160, and the second base electrode layer 170b, which is in contact with the lower and upper supports 142P and 144P and the dielectric layer 160. The insertion layer 172 may be inserted between the first base electrode layer 170a and the second base electrode layer 170b and may be adjacent to any one of the lower and upper supports 142P and 144P and the dielectric layer 160 with the second base electrode layer 170b between the insertion layer 172 and any one of the lower and upper supports 142P and 144P and the dielectric layer 160. The insertion layer 172 may include a horizontal extension 174, which is above the substrate 110 and extends in the first direction D1.

Referring to FIG. 8, a semiconductor device 100E may include a plurality of capacitors CP6. Each of the capacitors CP6 may include the substrate 110, the lower electrode LE1 which is above the substrate 110 and extends in the vertical direction D3, the lower and upper supports 142P and 144P surrounding the side wall of the lower electrode LE1 and supporting the lower electrode LE1, the dielectric layer 160 on the lower electrode LE1 and the lower and upper supports 142P and 144P, and an upper electrode UE1 on the dielectric layer 160. The lower electrode LE1 may include the base electrode layer 170 containing the halogen element 175 and the insertion layer 171 containing the carbon 176. The insertion layer 171 may be inserted in a portion of the lower electrode LE1, which is adjacent to the lower and upper supports 142P and 144P and the dielectric layer 160. The upper electrode UE1 may include a base electrode layer 180 containing a halogen element and an insertion layer 181 containing carbon. The insertion layer 181 may be inserted in a portion of the upper electrode UE1, which is adjacent to the dielectric layer 160.

FIGS. 9A to 9F are cross-sectional views of stages in a method of manufacturing a semiconductor device, according to embodiments. In FIGS. 1 to 9F, like reference numerals denote like elements, and redundant descriptions thereof are omitted.

Figure 9A:
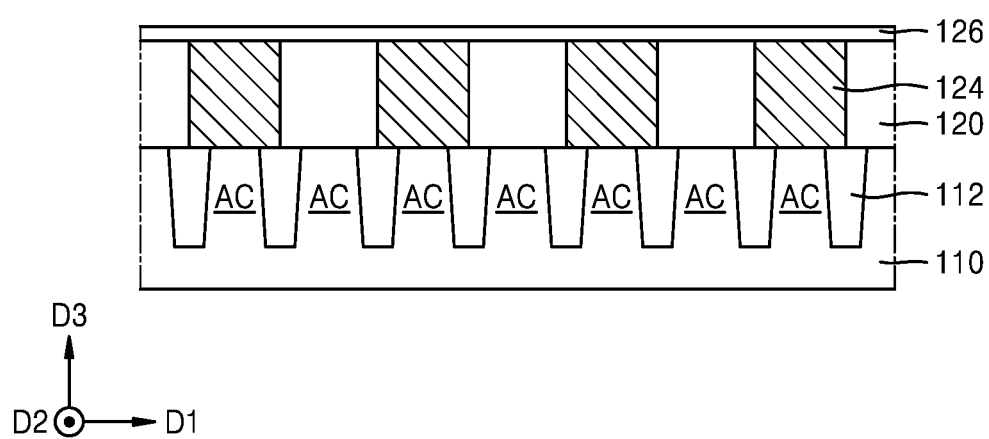
FIGS. 9A to 9F are cross-sectional views of stages in a method of manufacturing a semiconductor device, according to embodiments.

Referring to FIG. 9A, the lower structure 120 and a conductive region 124, which passes through the lower structure 120 to be connected to an active region AC, may be formed on the substrate 110, in which the active region AC is defined by the isolation film 112. Thereafter, an insulating film 126 covering the lower structure 120 and the conductive region 124 may be formed.

The insulating film 126 may be used as an etch stop layer in subsequent processes. The insulating film 126 may include or be formed of an insulating material having an etch selectivity with respect to the lower structure 120. In some embodiments, the insulating film 126 may include or be formed of an SiN film, an SiCN film, an SiBN film, or a combination thereof.

Figure 9B:
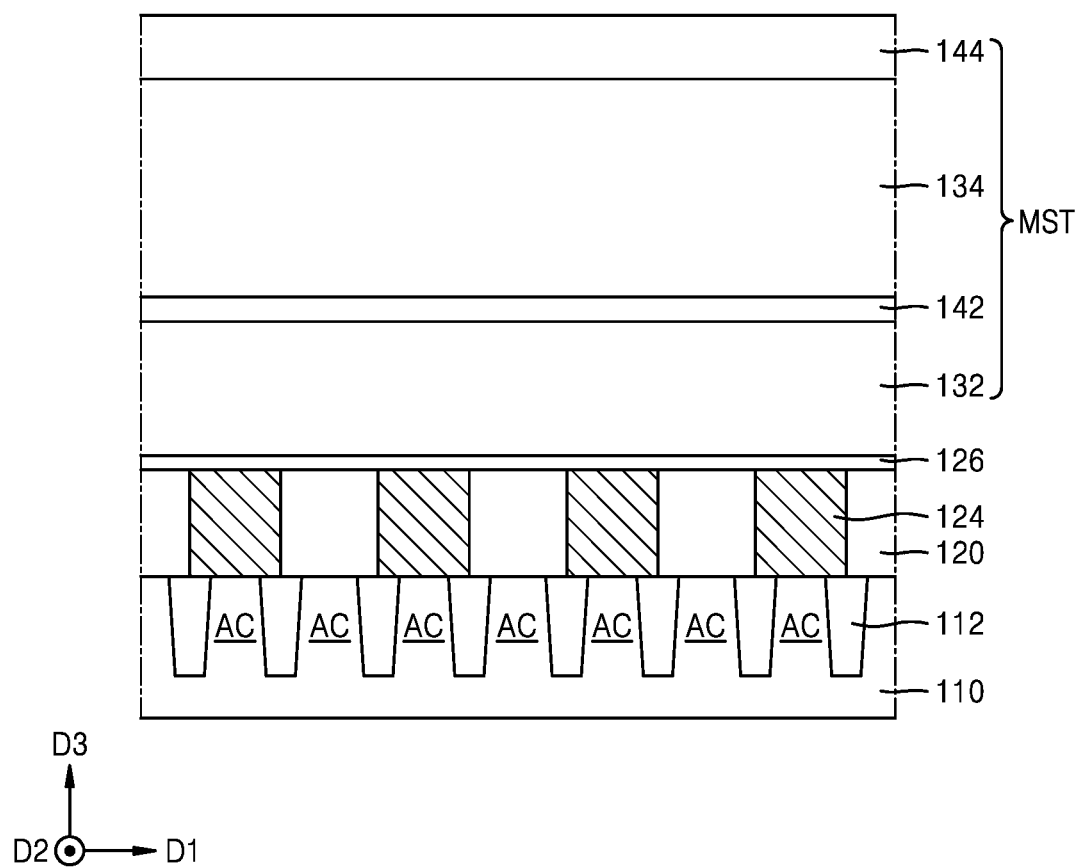

Referring to FIG. 9B, a mold structure MST may be formed on the insulating film 126. The mold structure MST may include a plurality of mold films and a plurality of support films. For example, the mold structure MST may include a first mold film 132, a lower support film 142, a second mold film 134, and an upper support film 144, which are sequentially stacked on the insulating film 126. Each of the first mold film 132 and the second mold film 134 may include or be formed of a material, which has a relatively high etch rate with respect to an etchant including ammonium fluoride ($NH_4F$), nitrogen fluoride (HF), and water, and is thus removable by a lift-off process using the etchant. In some embodiments, each of the first mold film 132 and the second mold film 134 may include or may be an oxide film, a nitride film, or a combination thereof. For example, the first mold film 132 may include or be a boro phospho silicate glass (BPSG) film. The BPSG film may include at least one selected from a first portion, in which the concentration of boron (B), the dopant, varies along the thickness direction of the BPSG film, and a second portion, in which the concentration of phosphorus (P), the dopant, varies along the thickness direction of the BPSG film. The second mold film 134 may include or be a silicon nitride film or a multi-layer insulating film, in which relatively thin silicon oxide films and silicon nitride films are alternately stacked on each other. However, the materials of the first mold film 132 and the second mold film 134 are not limited to those described above, and various changes and modification may be made therein without departing from the scope of the inventive concept. The stack sequence of films in the mold structure MST is not limited to that shown in FIG. 9B, and various changes and modification may be made therein without departing from the scope of the inventive concept.

Each of the lower support film 142 and the upper support film 144 may include or may be an SiN film, an SiCN film, an SiBN film, or a combination thereof. In some embodiments, the lower support film 142 may include or be formed of the same material as the upper support film 144. In some embodiments, the lower support film 142 may include a different material than the upper support film 144. In some embodiments, each of the lower support film 142 and the upper support film 144 may include or may be a silicon carbonitride film. In some embodiments, the lower support film 142 may include or be a silicon carbonitride film, and the upper support film 144 may include or be a boron-containing silicon nitride film. However, the materials of the lower support film 142 and the upper support film 144 are not limited to those described above, and various changes and modification may be made therein without departing from the scope of the inventive concept.

Figure 9C:
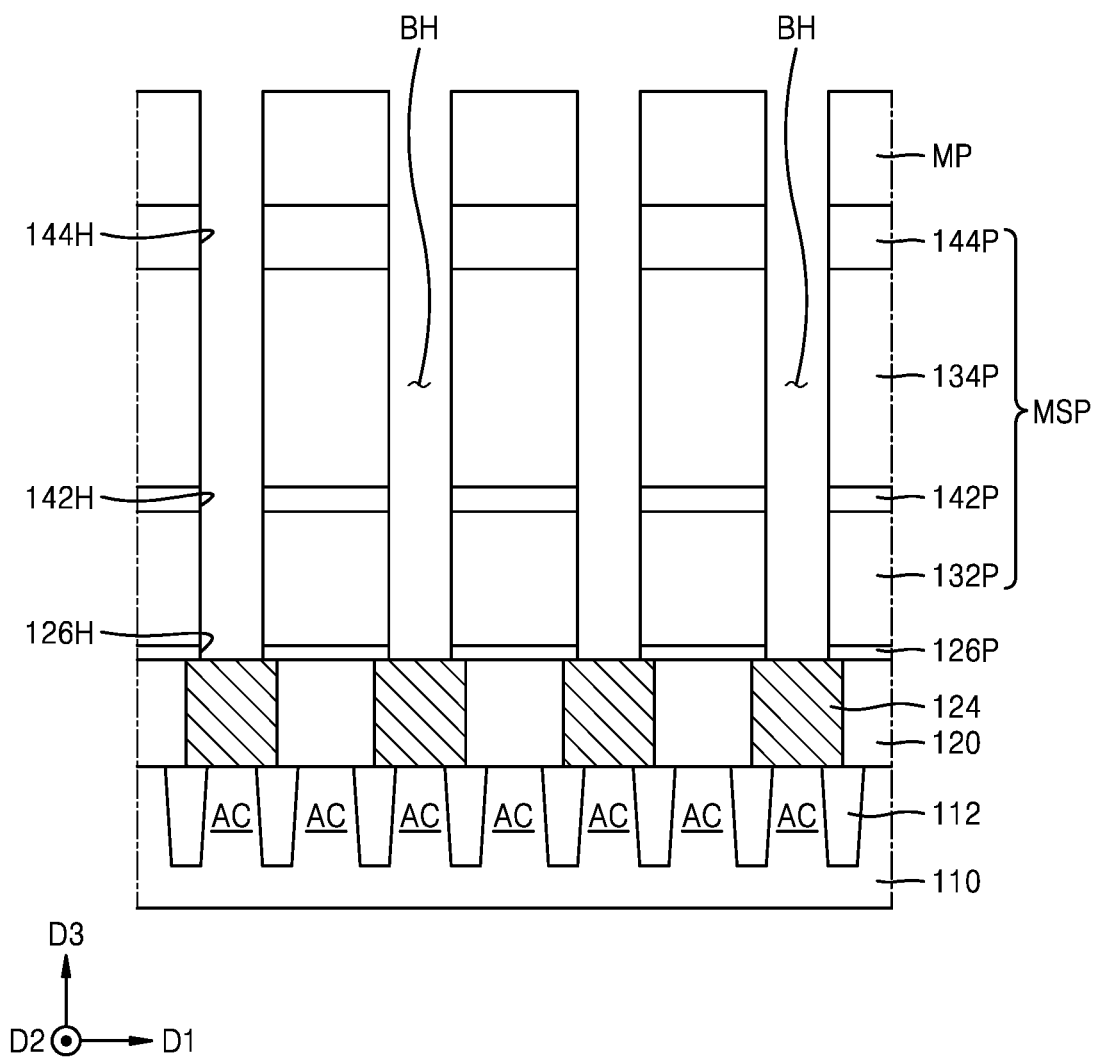

Referring to FIG. 9C, a mask pattern MP may be formed on the mold structure MST in the resultant structure of FIG. 9B, and the mold structure MST may be anisotropically etched by using the mask pattern MP as an etch mask and the insulating film 126 as an etch stop layer, so that a mold structure pattern MSP defining a plurality of holes BH may be formed. The mold structure pattern MSP may include a first mold pattern 132P, the lower support 142P, a second mold pattern 134P, and the upper support 144P.

The mask pattern MP may include or be formed of a nitride film, an oxide film, a polysilicon film, a photoresist film, or a combination thereof.

The process of forming the holes BH may further include performing wet processing on a structure resulting from the anisotropic etching of the mold structure MST. During the anisotropic etching of the mold structure MST and the wet processing of the resultant structure, the insulating film 126 may also be partially etched, thereby forming the insulating pattern 126P, which includes a plurality of openings 126H respectively exposing top surfaces of a plurality of conductive regions 124. For example, in the wet processing of the resultant structure from the anisotropic etching of the mold structure MST, an etchant including a diluted sulfuric acid peroxide (DSP) solution may be used, but embodiments are not limited thereto.

In the mold structure pattern MSP, respective portions of the holes BH in the lower support 142P may form a plurality of holes 142H, and respective portions of the holes BH in the upper support 144P may form a plurality of holes 144H.

Figure 9D:
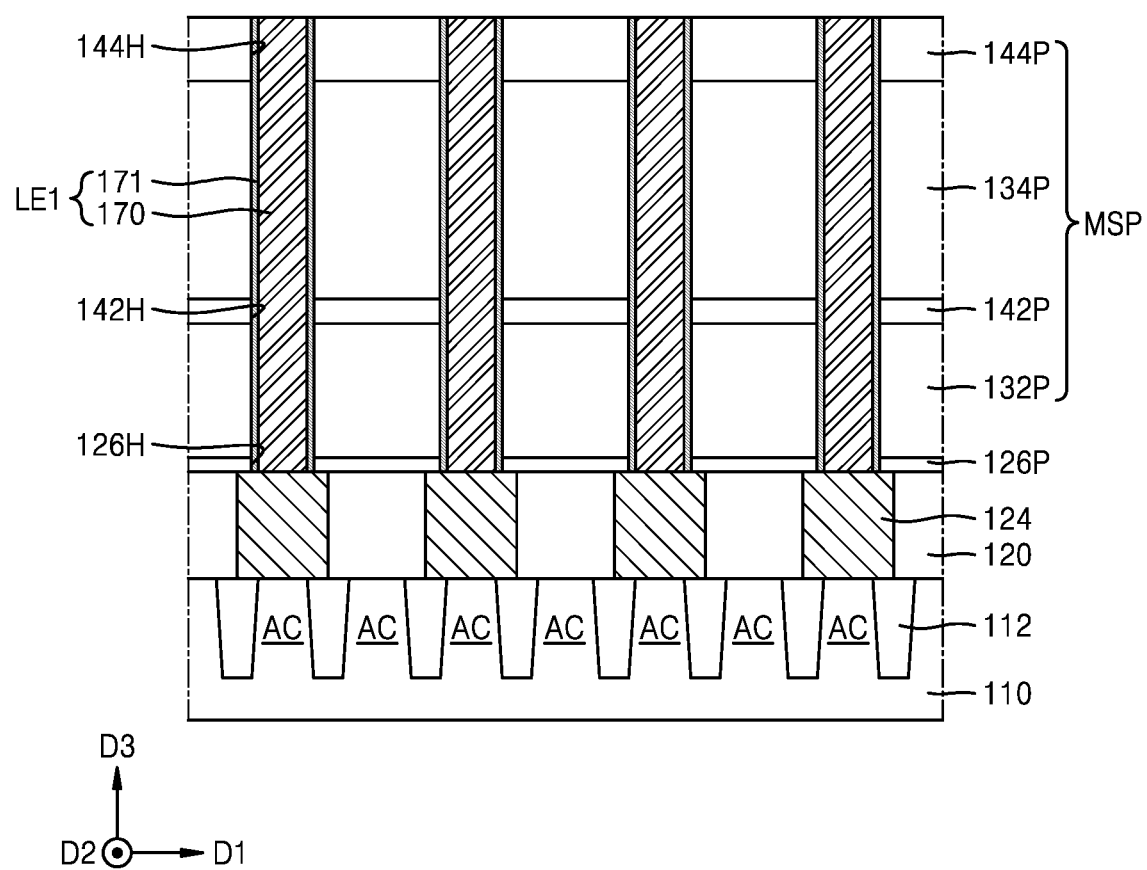

Referring to FIG. 9D, the mask pattern MP may be removed from the resultant structure of FIG. 9C, and a lower electrode LE1 filling each of the holes BH may be formed.

In some embodiments, to form the lower electrode LE1, a conductive layer may be formed to fill each of the holes BH and cover the top surface of the upper support 144P in the resultant structure of FIG. 9C. To form the conductive layer, chemical vapor deposition (CVD), plasma enhanced CVD (PECVD), metal organic CVD (MOCVD), or atomic layer deposition (ALD) may be used. Thereafter, the top surface of the upper support 144P may be exposed by removing the conductive layer using an etchback process or chemical mechanical polishing (CMP).

In detail, the lower electrode LE1 including the base electrode layer 170 containing a halogen element and the insertion layer 171 containing carbon may be formed, and the insertion layer 171 may be inserted in a portion of the lower electrode LE1, which is adjacent to the mold structure pattern MSP.

The insertion layer 171 may be formed from a precursor (e.g., precursor liquid or gas), which contains non-halogenated metal, in an environment with no precursor containing halogenated metal. The precursor containing non-halogenated metal may include or be a metallic glass precursor. In some embodiments, the precursor may include at least one selected from metal, carbon, hydrogen, and nitrogen. For example, when the insertion layer 171 includes TiN, the insertion layer 171 may be formed using $TiCH_4$. In some embodiments, the insertion layer 171 may be formed using $TiCH_4$ and $NH_3$ at a temperature of about 250° C. to about 700° C. under ALD conditions. Alternatively, the insertion layer 171 may be formed using $TiCH_4$ and $NH_3$ under CVD conditions. As a result, a C-containing TiN layer is formed.

The base electrode layer 170 may be formed from a precursor containing halogenated metal. For example, when the base electrode layer 170 includes TiN, the base electrode layer 170 may be formed using $TiCl_4$ as a halogenated Ti-containing precursor. The halogenated Ti-containing precursor may be used together with $NH_3$ for the vapor deposition of the base electrode layer 170. For example, appropriate vapor deposition conditions may include CVD or ALD. For example, the base electrode layer 170 may be formed using $TiCl_4$ and $NH_3$ at a temperature of about 250° C. to about 700° C. under ALD conditions. When the base electrode layer 170 is formed using $TiCl_4$ as a precursor under the temperature and conditions described above, the base electrode layer 170 may include Cl-containing TiN.

To form the lower electrode LE1 including the base electrode layer 170 containing a halogen element and the insertion layer 171 containing carbon, a nozzle supplying a precursor containing a halogen element and a nozzle supplying a precursor containing carbon may be separately used. The supply of a precursor containing a halogen element and a precursor containing carbon may be controlled according to a position in which the insertion layer 171 is inserted. Similar-type processes can be used to form the lower electrodes described in the other embodiments of FIGS. 4A-4C and FIGS. 5A-5E, as well as FIGS. 6-8, wherein the precursor(s) can be controlled to provide for the different structures described in those embodiments.

Figure 9E:
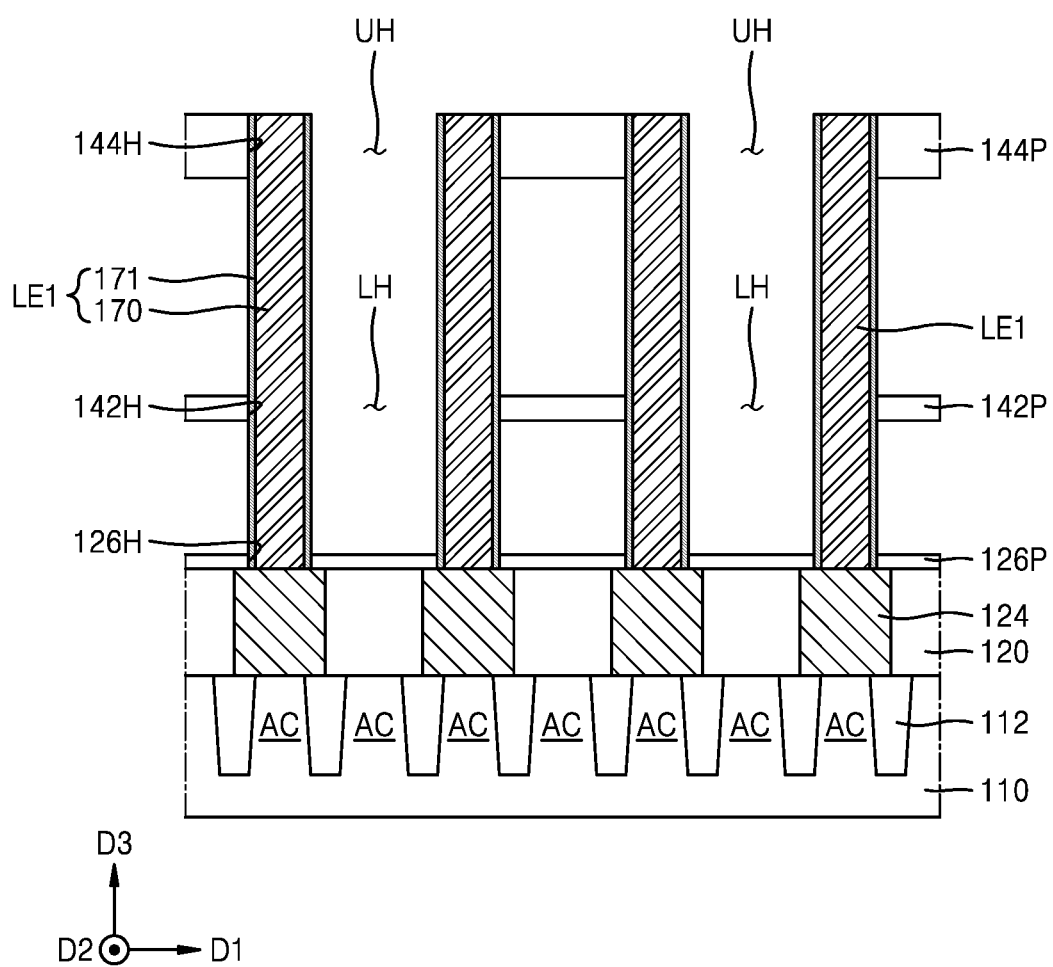

Referring to FIG. 9E, a plurality of upper holes UH may be formed by partially removing the upper support 144P from the resultant structure of FIG. 9D, and the second mold pattern 134P may be removed through the upper holes UH by a wet method. Thereafter, a plurality of lower holes LH may be formed by removing portions of the lower support 142P, which are exposed by the upper holes UH. Thereafter, the top surface of the insulating pattern 126P may be exposed by removing the first mold pattern 132P using a wet method through the lower holes LH. After the first mold pattern 132P and the second mold pattern 134P are removed, side walls of a plurality of lower electrodes LE1 may be exposed.

In some embodiments, an etchant including $NH_4F$, HF, and water may be used to remove the second mold pattern 134P and the first mold pattern 132P using a wet method, but embodiments are not limited thereto.

Figure 9F:
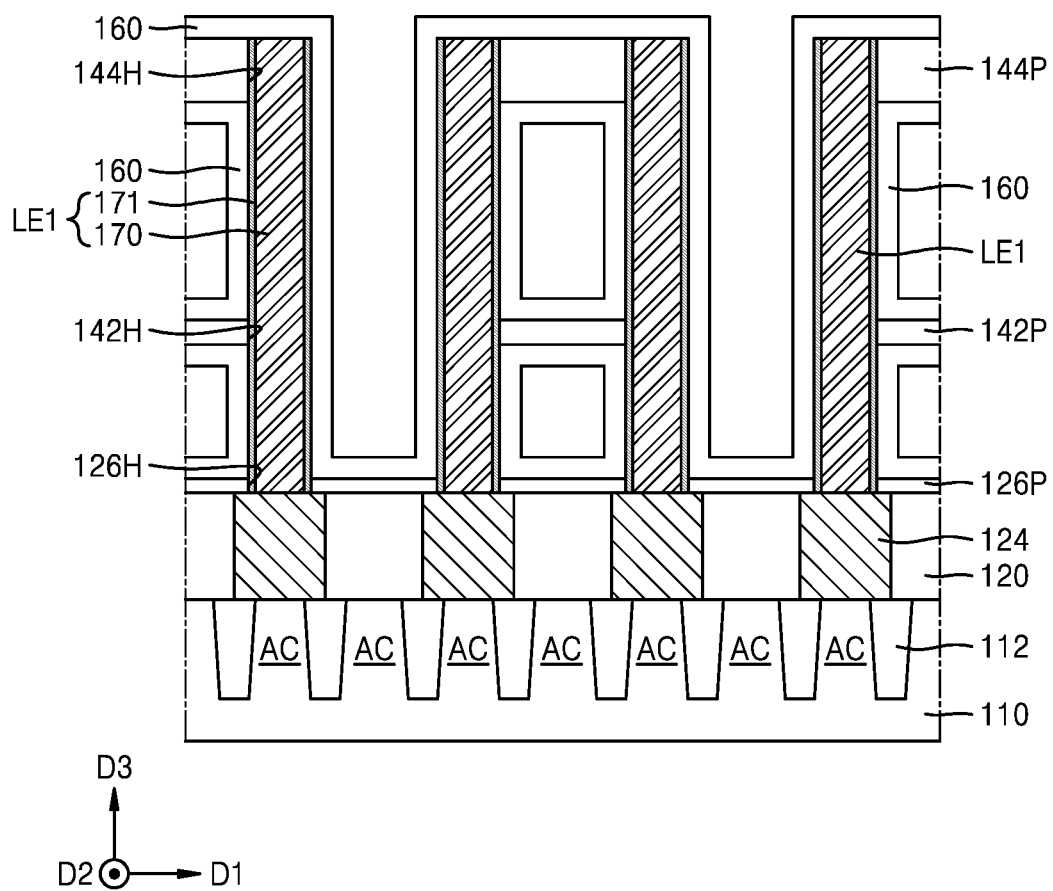

Referring to FIG. 9F, the dielectric layer 160 may be formed to cover the lower electrodes LE1 exposed in the resultant structure of FIG. 9E. The dielectric layer 160 may be formed to cover not only the side walls of the lower electrodes LE1 but also exposed surfaces of the lower and upper supports 142P and 144P and exposed surface of the insulating pattern 126P. CVD, PECVD, MOCVD, or ALD may be used to form the dielectric layer 160. After vapor deposition of the dielectric layer 160 on the lower electrodes LE1, annealing may be performed. In some embodiments, the annealing may be performed at a temperature of about 200° C. to about 700° C. The crystallinity of the dielectric layer 160 may be increased by the annealing performed after the dielectric layer 160 is formed.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a substrate;
   a lower electrode above the substrate, the lower electrode extending in a vertical direction;
   a support surrounding a side wall of the lower electrode and supporting the lower electrode;
   a dielectric layer on the lower electrode and the support; and
   an upper electrode on the dielectric layer,
   wherein the lower electrode includes a base electrode layer and an insertion layer outside at least part of the base electrode layer, the base electrode layer containing a halogen element, and the insertion layer containing carbon, and
   wherein the insertion layer is inserted in a portion of the lower electrode, the portion of the lower electrode being adjacent to the support and the dielectric layer.

2. The semiconductor device of claim 1, wherein the insertion layer includes a first portion and a second portion, the first portion contacting the support at a boundary between the support and the lower electrode, and the second portion contacting the dielectric layer at a boundary between the dielectric layer and the lower electrode.

3. The semiconductor device of claim 1, wherein the base electrode layer includes a first base electrode layer and a second base electrode layer, the first base electrode layer not contacting the support or the dielectric layer, the second base electrode layer contacting the support and the dielectric layer, and
wherein the insertion layer is inserted between the first base electrode layer and the second base electrode layer and is adjacent to each of the support and the dielectric layer with the second base electrode layer between the insertion layer and each of the support and the dielectric layer.

4. The semiconductor device of claim 1, wherein a horizontal width of the lower electrode is about 1 nm to about 20 nm, and a horizontal width of the insertion layer is about 0.25 nm to about 5 nm and is smaller than the horizontal width of the lower electrode.

5. The semiconductor device of claim 1, wherein a carbon concentration in the insertion layer is greater than or equal to about 0.5 atom % and less than or equal to about 10 atom %.

6. The semiconductor device of claim 1, wherein a halogen element concentration in the base electrode layer is greater than 0 atom % and less than or equal to about 10 atom %.

7. The semiconductor device of claim 1, wherein a ratio of a horizontal width of the insertion layer to a horizontal width of the base electrode layer is greater than 0 and less than or equal to about ¼.

8. The semiconductor device of claim 1, wherein the insertion layer further includes a horizontal extension above the substrate, the horizontal extension extending in a horizontal direction.

9. The semiconductor device of claim 1, wherein the lower electrode includes metal nitride.

10. A semiconductor device comprising:
a substrate;
a lower electrode above the substrate, the lower electrode extending in a vertical direction;
a support contacting a side wall of the lower electrode and supporting the lower electrode;
a dielectric layer on the lower electrode and the support; and
an upper electrode on the dielectric layer,
wherein the lower electrode includes a base electrode layer and carbon, the base electrode layer containing a halogen element, and the carbon being distributed in the base electrode layer,
wherein the base electrode layer includes a periphery and a core, the periphery extending in the vertical direction and including a portion adjacent to the support and the dielectric layer, and the core extending in the vertical direction and including a portion not adjacent to the support or the dielectric layer, and
wherein a concentration of the carbon in the lower electrode is higher in the periphery than in the core.

11. The semiconductor device of claim 10, wherein the concentration of the carbon in the lower electrode is highest at a boundary between the lower electrode and each of the support and the dielectric layer.

12. The semiconductor device of claim 10, wherein the concentration of the carbon in the lower electrode is highest in the periphery of the base electrode layer at a boundary between the periphery and the core of the base electrode layer.

13. The semiconductor device of claim 10, wherein a horizontal width of the lower electrode is about 1 nm to about 20 nm, and a horizontal width of the periphery of the base electrode layer is about 0.25 nm to about 5 nm and is smaller than the horizontal width of the lower electrode.

14. The semiconductor device of claim 10, wherein a carbon concentration in the periphery of the base electrode layer is greater than or equal to about 0.5 atom % and less than or equal to about 10 atom %.

15. The semiconductor device of claim 10, wherein a halogen element concentration in the base electrode layer is greater than about 0 atom % and less than or equal to about 10 atom %.

16. The semiconductor device of claim 10, wherein a ratio of a horizontal width of the periphery of the base electrode layer to a horizontal with of the base electrode layer is less than or equal to about ¼.

17. A semiconductor device comprising:
a substrate;
an active region defined by an isolation film in the substrate;
a word line extending in the substrate in a first horizontal direction across the active region;
a bit line above the word line, the bit line extending in a second horizontal direction that is perpendicular to the first horizontal direction; and
a capacitor in an upper level above the bit line,
wherein the capacitor includes:
a lower electrode above the substrate, the lower electrode extending in a direction that is perpendicular to a top surface of the substrate;
a support surrounding a side wall of the lower electrode and supporting the lower electrode;
a dielectric layer on the lower electrode and the support; and
an upper electrode on the dielectric layer,
wherein the lower electrode includes a base electrode layer and an insertion layer, the base electrode layer containing a halogen element, and the insertion layer containing carbon, and
wherein the insertion layer is inserted in a portion of the lower electrode, the portion of the lower electrode being adjacent to the support and the dielectric layer.

18. The semiconductor device of claim 17, wherein the insertion layer includes a first portion and a second portion, the first portion contacting the support at a boundary between the support and the lower electrode, and the second portion contacting the dielectric layer at a boundary between the dielectric layer and the lower electrode.

19. The semiconductor device of claim 17, wherein the base electrode layer includes a first base electrode layer and a second base electrode layer, the first base electrode layer contacting the support and the dielectric layer, the second base electrode layer not contacting the support or the dielectric layer, and
wherein the insertion layer is inserted between the first base electrode layer and the second base electrode layer and is adjacent to each of the support and the dielectric layer with the first base electrode layer between the insertion layer and each of the support and the dielectric layer.

20. The semiconductor device of claim 17, wherein a concentration of the carbon in the lower electrode is higher in the insertion layer than in the base electrode layer.

* * * * *